(12) United States Patent
Hayashi

(10) Patent No.: US 7,667,395 B2
(45) Date of Patent: Feb. 23, 2010

(54) LIGHT EMITTING DEVICE, METHOD OF MANUFACTURING LIGHT EMITTING DEVICE, AND ELECTRONIC APPARATUS

(75) Inventor: Kenji Hayashi, Suwa-shi (JP)

(73) Assignee: Seiko Epson Corporation, Tokyo (JP)

( * ) Notice: Subject to any disclaimer, the term of this patent is extended or adjusted under 35 U.S.C. 154(b) by 483 days.

(21) Appl. No.: 11/332,255

(22) Filed: Jan. 17, 2006

(65) Prior Publication Data

US 2006/0158108 A1 Jul. 20, 2006

(30) Foreign Application Priority Data

Jan. 17, 2005 (JP) ............... 2005-008696
Dec. 7, 2005 (JP) ............... 2005-353029

(51) Int. Cl.
*H01J 1/62* (2006.01)
*H01J 63/04* (2006.01)

(52) U.S. Cl. ............ 313/512; 313/504; 313/506; 313/498; 257/40

(58) Field of Classification Search ......... 313/504–506, 313/512, 498; 257/40, 79–103, 787–796
See application file for complete search history.

(56) References Cited

U.S. PATENT DOCUMENTS

| 5,686,360 | A | 11/1997 | Harvey, III et al. |
| 6,429,584 | B2 | 8/2002 | Kubota |
| 6,710,542 | B2 | 3/2004 | Chun et al. |
| 6,873,101 | B2 * | 3/2005 | Nilsson et al. ............ 313/512 |
| 7,187,077 | B1 * | 3/2007 | Nagarajan ............... 257/730 |
| 2001/0033347 | A1 | 10/2001 | Kitahora et al. |
| 2002/0024096 | A1 * | 2/2002 | Yamazaki et al. ......... 257/359 |
| 2002/0180371 | A1 * | 12/2002 | Yamazaki et al. ....... 315/169.3 |
| 2003/0085654 | A1 * | 5/2003 | Hayashi .................. 313/506 |
| 2004/0212759 | A1 * | 10/2004 | Hayashi .................. 349/84 |

FOREIGN PATENT DOCUMENTS

| JP | 09-185994 | 7/1997 |
| JP | 2000-223264 | 8/2000 |
| JP | 2001-284041 | 10/2001 |
| JP | 2003-017244 | 1/2003 |
| JP | 2003-088796 | 3/2003 |
| JP | 2003-142255 | 5/2003 |

* cited by examiner

*Primary Examiner*—Nimeshkumar D. Patel
*Assistant Examiner*—Thomas A Hollweg
(74) *Attorney, Agent, or Firm*—Oliff & Berridge, PLC

(57) ABSTRACT

A light emitting device includes on a base member: a plurality of first electrodes; a barrier wall having a plurality of opening portions corresponding to the plurality of first electrodes; organic functional layers disposed in the opening portions; a second electrode covering the barrier wall and the organic functional layers; an organic buffer layer covering the second electrode; a gas barrier layer disposed to cover patterns of the organic buffer layer and surroundings thereof; and an outside reinforcing layer disposed to cover the outer circumferential region of the organic buffer layer.

19 Claims, 15 Drawing Sheets

LIGHT EMITTING DEVICE, METHOD OF MANUFACTURING LIGHT EMITTING DEVICE, AND ELECTRONIC APPARATUS

BACKGROUND

1. Technical Field

The present invention relates to a light emitting device, a method of manufacturing the light emitting device, and an electronic apparatus having the light emitting device.

2. Related Art

In recent years, needs for flat panel display devices with small power consumption and weight have been increased with diversification of information instruments. As one of such flat panel display devices, an organic EL (Electroluminescence) device having a light emitting layer is known. Such an organic EL device generally has a configuration that a light emitting layer is disposed between a positive electrode and a negative electrode. In order to improve a hole injection ability or an electron injection ability, a configuration that a hole injecting layer is disposed between the positive electrode and the light emitting layer or a configuration that an electron injecting layer is disposed between the light emitting layer and a negative electrode has been suggested.

Materials used for a light emitting layer, a hole injecting layer, and an electron injecting layer of the organic EL device are often deteriorated through reaction with moisture in the air. The deterioration of the layers forms a light non-emitting area, which is referred to as a dark spot, in the organic EL device, thereby shortening the lifetime as a light emitting device. Therefore, such an organic EL device requires that influence by moisture or oxygen should be suppressed.

In order to solve such a problem, a technique of preventing invasion of moisture or oxygen by bonding a seal member made of glass or metal to a substrate of the organic EL device has generally been employed. However, with increase in size and decrease in thickness and weight of displays, it is difficult to prevent the invasion of moisture or oxygen only by the use of the bonded seal member. In order to satisfactorily secure areas for forming driving elements or wires with increase in size, needs for a top emission structure in which light is taken out from the seal member haven been suggested. For the purpose of accomplishing such requirement, a sealing structure using a transparent thin film with small weight and high strength has been required.

Therefore, in recent years, in order to cope with increase in size and decrease in thickness of display devices, techniques, which are referred to as thin film sealing, of forming a thin film made of silicon nitride, silicon oxide, and ceramics having a light transmitting property and an excellent gas barrier property as a gas barrier layer on a light emitting element by the use of a high density plasma method (for example, a ion plating method, an ECR plasma sputtering method, an ECR plasma CVD method, a surface wave plasma CVD method, an ICP-CVD method, or the like) have been used (for example, see JP-A-9-185994, JP-A-2001-284041, JP-A-2000-223264, and JP-A-2003-17244). According to such techniques, it is possible to prevent the invasion of moisture into the light emitting elements.

However, even by using such techniques, it is not possible to completely prevent the invasion of moisture from the outside, thereby not obtaining sufficient emission characteristic or emission lifetime. Specifically, detachment or crack is generated in outer circumferential portions or stepped portions of the gas barrier layer and thus the invasion of moisture through the detachment or crack is detected.

For this reason, it is considered that the generation of crack in the gas barrier layer is prevented by disposing an organic buffer layer having an approximately flat top surface below the gas barrier layer. That is, stress generated due to the warping or volume expansion of a substrate can be alleviated by the organic buffer layer. In addition, since the gas barrier layer disposed on the top surface of the organic buffer layer is approximately flattened by approximately flattening the top surface of the organic buffer layer, portions on which stress is concentrated disappear from the gas barrier layer, thereby preventing the generation of crack.

When the organic buffer layer is thermally deformed (expanded or contracted), crack is generated in the gas barrier layer. Accordingly, there is a problem that the invasion of moisture from the outside cannot be completely prevented.

SUMMARY

An advantage of some aspects of the present invention is to provide a light emitting device in which invasion of moisture due to detachment or crack of a gas barrier layer can be suppressed, a method of manufacturing the light emitting device, and an electronic apparatus having the light emitting device.

The light emitting device, the method of manufacturing the light emitting device, and the electronic apparatus according to the invention employ the following configurations.

According to a first aspect of the invention, there is provided a light emitting device comprising on a base member: a plurality of first electrodes; a barrier wall having a plurality of opening portions corresponding to the plurality of first electrodes; organic functional layers disposed in the opening portions; a second electrode covering the barrier wall and the organic functional layers; an organic buffer layer covering the second electrode; a gas barrier layer disposed to cover patterns of the organic buffer layer and surroundings thereof; and an outside reinforcing layer disposed to cover the outer circumferential region of the organic buffer layer.

In the first aspect of the invention, since an intermediate protective layer is disposed between the gas barrier layer and the organic buffer layer, the gas barrier layer is not affected directly by the deformation of the organic buffer layer even when the organic buffer layer is thermally deformed (expanded and contracted), thereby preventing generation of defects such as cracks in the gas barrier layer. Specifically, defects such as cracks can be often generated in the gas barrier layer which covers the surroundings of the end surfaces of the patterns of the organic buffer layer, but it is possible to effectively prevent the generation of defects such as cracks in the gas barrier layer by disposing an intermediate protective layer in the regions.

The outside reinforcing layer may be disposed to cover surroundings of the edges of the patterns of the organic buffer layer. In this configuration, defects such as cracks can be often generated in the gas barrier layer which covers the surroundings of the end surfaces of the patterns of the organic buffer layer, but it is possible to effectively prevent the generation of defects such as cracks in the gas barrier layer by disposing the outside reinforcing layer in the regions.

The outside reinforcing layer may be disposed to cover the outer circumferential regions of patterns of the gas barrier layer and surroundings thereof. In this configuration, by disposing the outside reinforcing layer in the regions, it is possible to effectively prevent the generation of defects such as cracks in the gas barrier layer.

The light emitting device according to the first aspect of the invention may further comprise an electrode protecting layer covering the second electrode. In this configuration, it is possible to prevent corrosion or damage of the second electrode in the manufacturing process.

The light emitting device according to the first aspect of the invention may further comprise a protective layer covering the gas barrier layer. In this configuration, it is possible to protect the gas barrier layer from external mechanical impacts.

A contact angle of the edge of the organic buffer layer may be less than or equal to 45°. In this configuration, since the influence of the thermal deformation (expansion and contraction) of the organic buffer layer on the gas barrier layer is alleviated, it is possible to greatly reduce the possibility that the defects such as cracks could be generated in the gas barrier layer.

The outside reinforcing layer may be made of resin. In this configuration, it is possible to easily adjust the force for reinforcing the gas barrier layer.

The outside reinforcing layer may contain fine particles. In this configuration, it is possible to facilitate the formation of the outside reinforcing layer on the slope by adjusting the fluidity of the material for forming the outside reinforcing layer. In addition, since it is difficult that the outside reinforcing layer generates variation in volume at the time of forming a coated layer or variation in temperature, it is possible to reduce load on the gas barrier layer.

The outside reinforcing layer and the organic buffer layer may be made of the same resin. In this case, it is possible to make the cost for materials or the formation processes more efficient.

The protective layer may be disposed to expose the outer circumferential region of the outside reinforcing layer. In this case, since the outside reinforcing layer has a function of protecting the side surface of the gas barrier layer and a function of preventing extrusion of the protective layer at the time of forming the protective layer, it is possible to reduce the area for forming the protective layer to the minimum.

The protective layer may include an adhesive layer covering the gas barrier layer and a surface protecting film. In this case, it is possible to reduce the area for forming the surface protecting film to the minimum.

According to a second aspect of the invention, there is provided a method of manufacturing a light emitting device, the method comprising, on a base member: forming a plurality of first electrodes; forming a barrier wall having a plurality of opening portions corresponding to the plurality of first electrodes; forming organic functional layers disposed in the plurality of opening portions; forming a second electrode covering the barrier wall and the organic functional layers; forming an organic buffer layer covering the second electrode and having a flat top surface; forming a gas barrier layer covering the organic buffer layer; and forming an outside reinforcing layer covering at least the outer circumferential region of the gas barrier layer.

In the second aspect of the invention, since the outer circumferential region of the gas barrier layer is reinforced, it is possible to effectively prevent the generation of defects such as cracks in the gas barrier layer even when the organic buffer layer is thermally deformed (expanded and contracted).

The forming of the outside reinforcing layer may include depositing an organic material containing fine particles on at least the outer circumferential region of the gas barrier layer. In this case, since the fluidity of the material for forming the outside reinforcing layer, it is possible to easily form the outside reinforcing layer on the slope. In addition, since it is difficult that the outside reinforcing layer generates variation in volume at the time of forming a coated layer or variation in temperature, it is possible to reduce load on the gas barrier layer.

The method according to the second aspect of the invention may further comprising forming a protective layer covering the gas barrier layer and the outside reinforcing layer to expose the outer circumferential region of the outside reinforcing layer. In this case, since the outside reinforcing layer has a function of protecting the side surface of the gas barrier layer and a function of preventing extrusion of the protective layer at the time of forming the protective layer, it is possible to reduce the area for forming the protective layer to the minimum.

The forming of the protective layer may include: forming an adhesive layer covering the gas barrier layer and a part of the outside reinforcing layer; disposing a surface protecting film on the adhesive layer; and cutting the surface protecting film approximately along the outer circumference of the adhesive layer. In this case, it is possible to reduce the area for forming the surface protecting film to the minimum.

According to a third aspect of the invention, there is provided an electronic apparatus comprising the above-mentioned light emitting device. In this configuration, since the invasion of moisture into the organic functional layers little occurs, the deterioration of the organic functional layers can be suppressed, thereby obtaining an electronic apparatus having a display unit with a long lifetime.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, exemplary embodiments of a light emitting device, a method of manufacturing a light emitting device, and an electronic apparatus according to the present invention will be described with reference to the attached drawings. An EL (electroluminescence) display device using an organic EL material which is an example of an organic functional material will be described as the light emitting device.

FIRST EMBODIMENT

Figure 1:
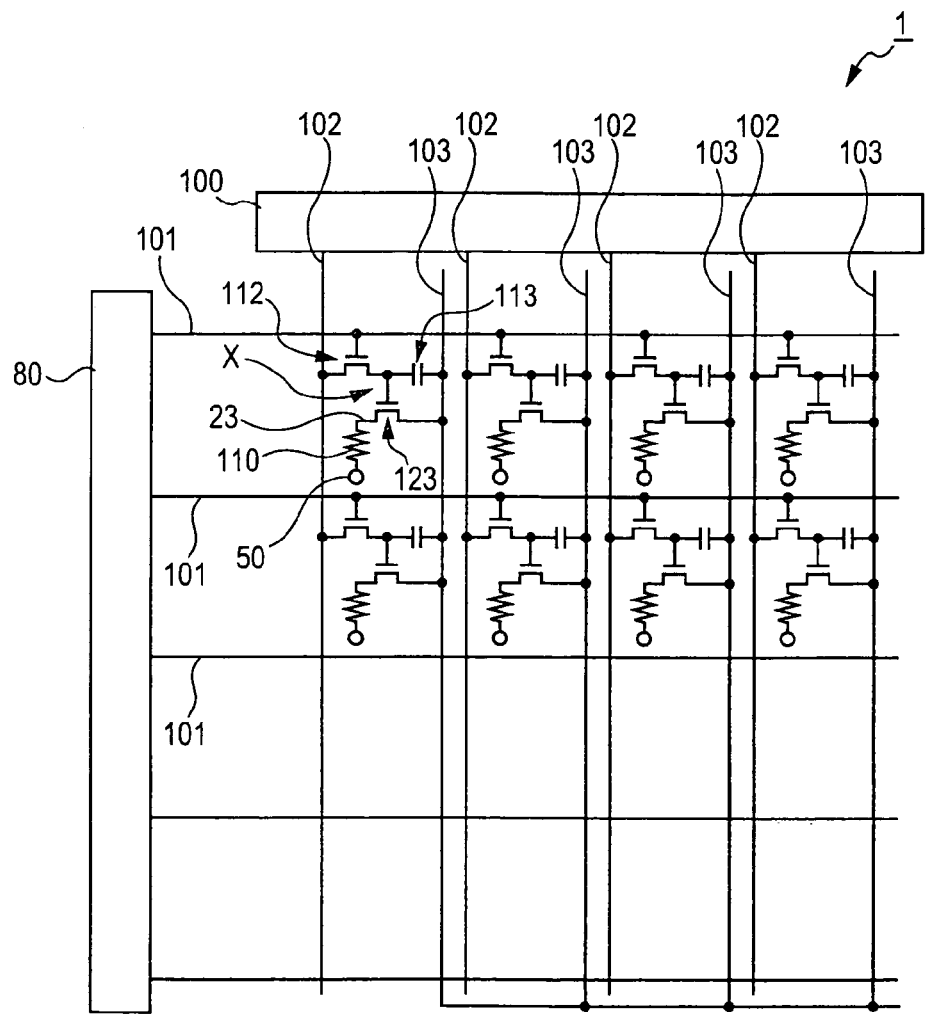
FIG. 1 is a diagram illustrating a wiring structure of an EL display device 1 according to a first embodiment of the present invention.

FIG. 1 is a diagram illustrating a wiring structure of an EL display device 1 according to a first embodiment of the present invention.

The EL display device 1 is an active matrix EL display device employing thin film transistors (hereinafter, abbreviated as TFT) as switching elements.

In the following description, portions or layers constituting the EL display device 1 are expressed in different scales for the purpose of clearly recognizing them.

The EL display device (light emitting device) 1 includes, as shown in FIG. 1, a plurality of scanning lines 101, a plurality of signal lines 102 extending in a direction perpendicular to the scanning lines 101, and a plurality of power supply lines 103 extending in parallel to the signal lines 102. Pixel regions X are disposed in the vicinity of the intersections between the scanning lines 101 and the signal lines 102.

A data line driving circuit 100 including a shift register, a level shifter, video lines, and analog switches is connected to the signal lines 102. Scanning line driving circuits 80 including a shift register and a level shifter are connected to the scanning lines 101.

In each pixel region X, a switching TFT 112 of which the gate electrode is supplied with a scanning signal through the corresponding scanning line 101, a storage capacitor 113 storing a pixel signal supplied with from the corresponding signal line 102 through the switching TFT 112, a driving TFT 123 of which the gate electrode is supplied with the pixel signal stored in the storage capacitor 113, a pixel electrode (first electrode) 23 in which driving current flows from the corresponding power supply line 103 when it is electrically connected to the power supply line 103 through the driving TFT 123, and a functional layer 110 interposed between the pixel electrode 23 and a negative electrode (second electrode) 50 are disposed. The pixel electrode 23, the negative electrode 50, and the functional layer 110 constitute a light emitting element (organic EL element).

In the EL display device 1, when the scanning line 101 is driven and the switching TFT 112 is turned on, the potential of the signal line 102 at that time is stored in the storage capacitor 113 and the ON/OFF state of the driving TFT 123 is determined in accordance with the state of the storage capacitor 113. Current flows in the pixel electrode 23 from the power supply line 103 through the channel of the driving TFT 123 and the current flows in the negative electrode 50 through the functional layer 110. The functional layer 110 emits light in accordance with the amount of current flowing in the functional layer.

Next, a specific configuration of the EL display device 1 will be described with reference to FIGS. 2 to 5.

Figure 2:
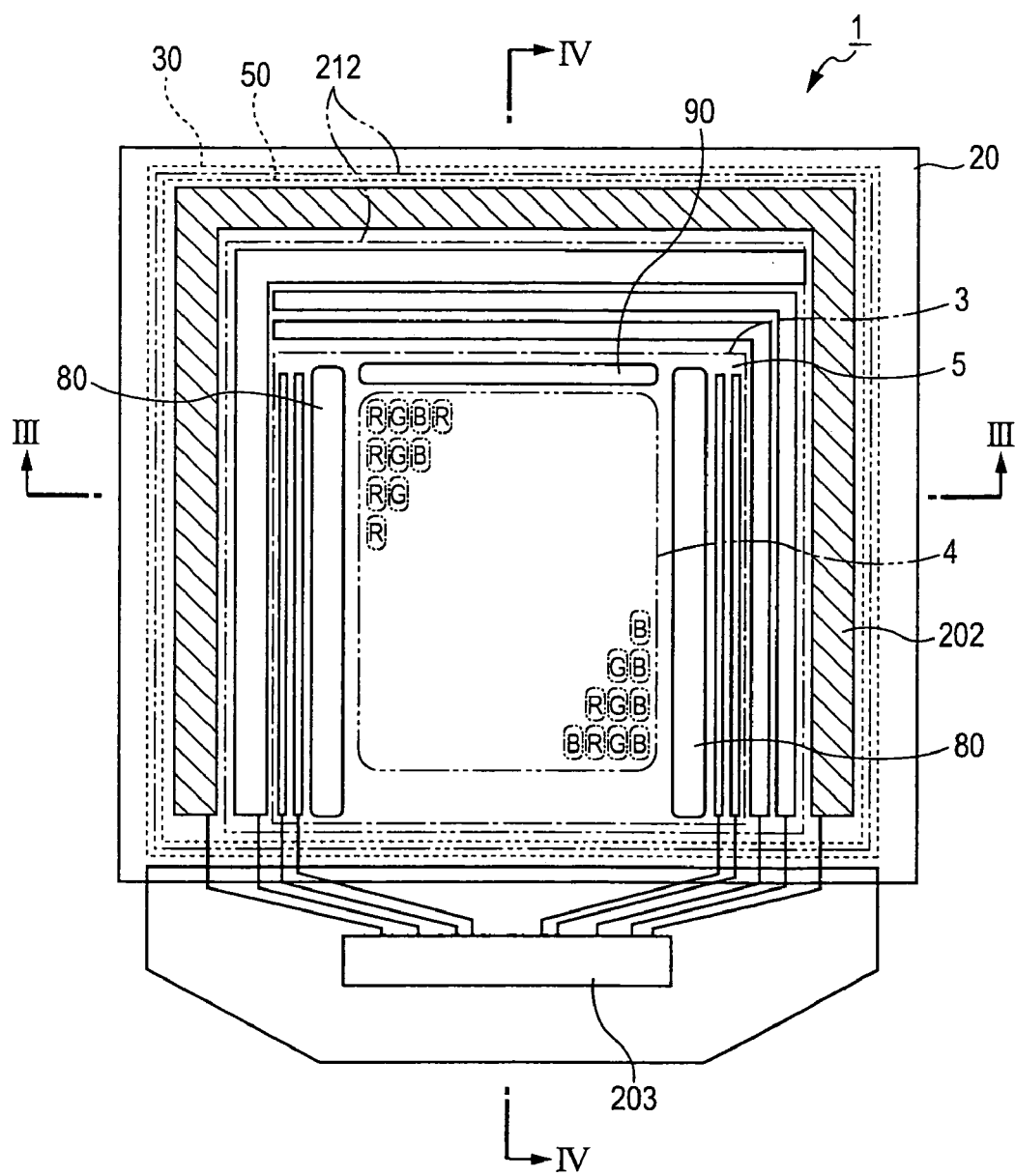
FIG. 2 is a schematic diagram illustrating a configuration of the EL display device 1.

The EL display device 1 is of an active matrix type including, as shown in FIG. 2, a substrate 20 having an electrical insulation property, a pixel electrode area (not shown) in which the pixel electrodes connected to the driving TFTs (not shown) are arranged in a matrix on the substrate 20, power supply lines (not shown) which are disposed around the pixel electrode area and are connected to the pixel electrodes, and a pixel part 3 (inside the one-dot chained line in FIG. 2) which is positioned on at least the pixel electrode area and which has an approximately rectangular shape as seen two-dimensionally.

In the invention, the substrate 20 and the switching TFTs, various circuits, and interlayer insulating layers formed thereon as described later are together referred to as a base member (denoted by reference numeral 200 in FIGS. 3 and 4).

The pixel part 3 is partitioned into an actual display area 4 at the center thereof and a dummy area 5 (an area between the one-dot chained line and the two-dot chained line) disposed around the actual display area 4.

In the actual display area 4, display regions R, G, and B having pixel electrodes, respectively, are arranged in a matrix to be apart from each other in the A-B direction and the C-D direction.

The scanning line driving circuits 80 are disposed on both sides of the actual display area 4 in FIG. 2. The scanning line driving circuits 80 are disposed below the dummy area 5.

An inspection circuit 90 is disposed at the upper side of the actual display area 4 in FIG. 2. The inspection circuit 90 is a circuit for inspecting the operation statuses of the EL display device 1. For example, the inspection circuit 90 includes an inspection information output circuit (not shown) for outputting the inspection result externally and serves to perform the inspection of quality and defects of the display device at the time of manufacturing or shipping. The inspection circuit 90 is disposed below the dummy area 5.

The scanning line driving circuits 80 and the inspection circuit 90 are supplied with driving voltages through a driving voltage supply unit 310 (see FIG. 3) and a driving voltage supply unit 340 (see FIG. 4) from a predetermined power source. The driving control signals and the driving voltages supplied to the scanning line driving circuits 80 and the inspection circuit 90 are supplied through a driving control signal supply unit 320 (see FIG. 3) and a driving voltage supply unit 350 (see FIG. 4) from a predetermined main driver for controlling the operation of the EL display device 1. In this case, the driving control signal is an instruction signal from the main driver involved in the control when the scanning line driving circuits 80 and the inspection circuit 90 outputs signals.

Figure 3:
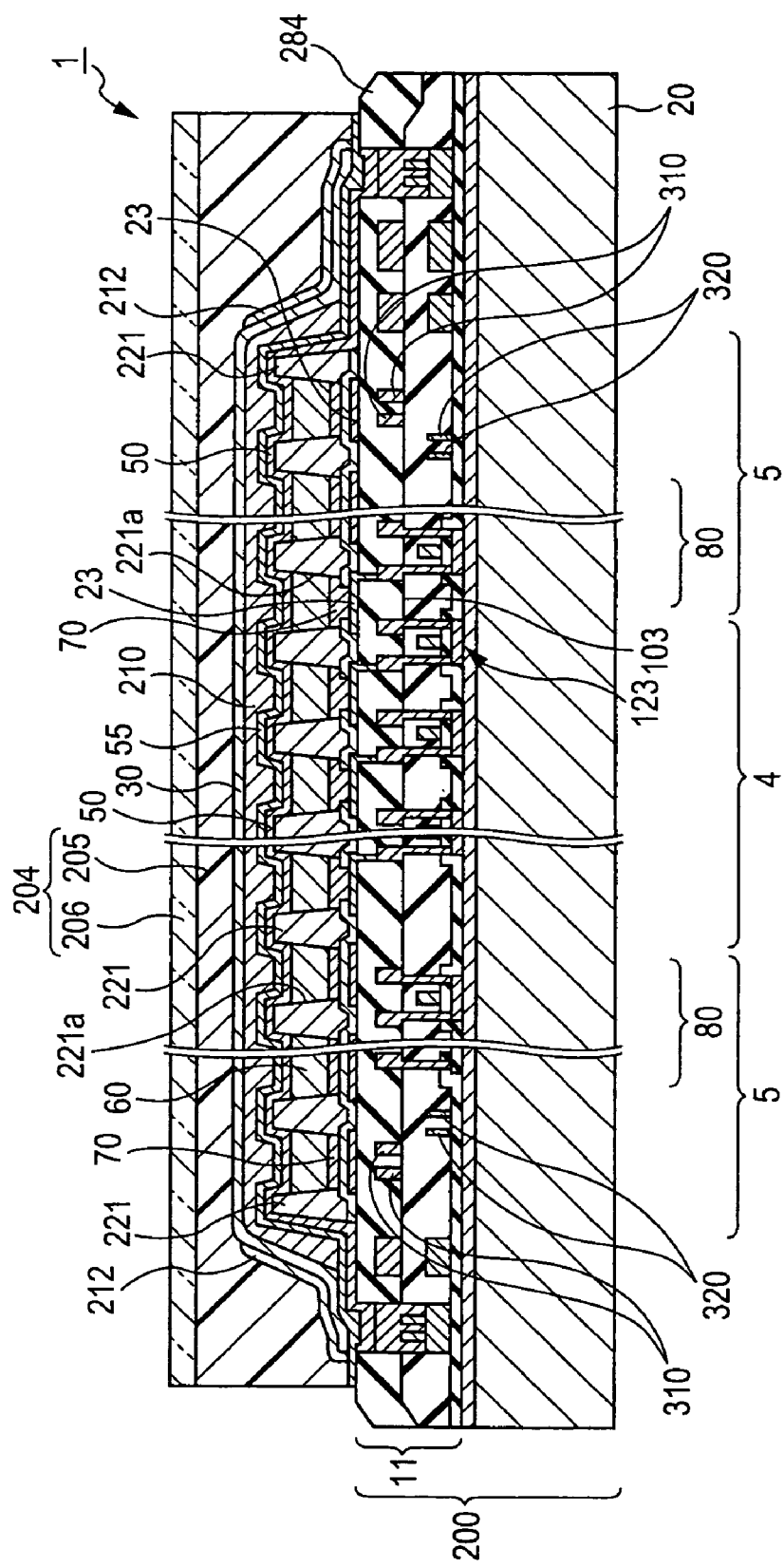
FIG. 3 is a cross-sectional view taken along Line A-B of FIG. 2.
Figure 4:
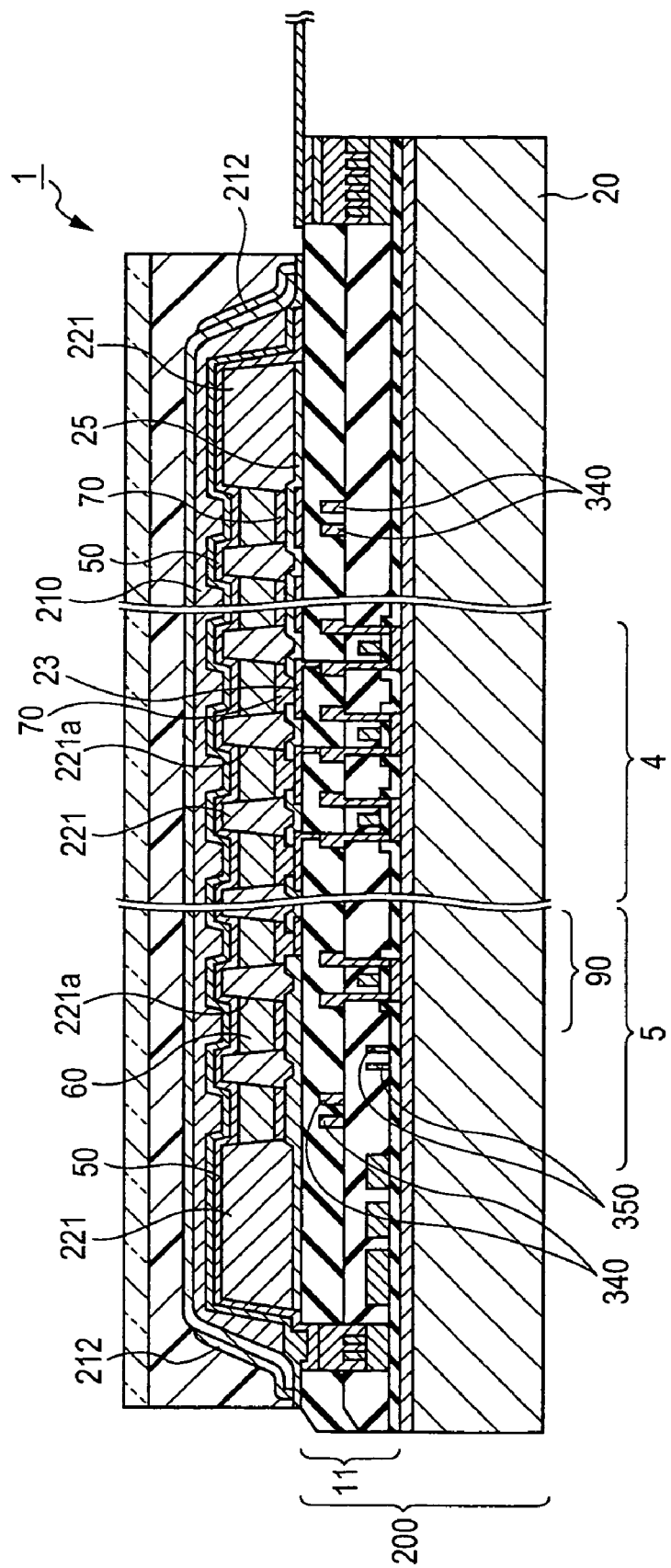
FIG. 4 is a cross-sectional view taken along Line C-D of FIG. 2.

In the EL display device 1, as shown in FIGS. 3 and 4, a plurality of light emitting elements (organic EL elements) having the pixel electrode 23, the light emitting layer 60, and the negative electrode 50 are formed on the base member 200 and an organic buffer layer 210, a gas barrier layer 30, and an outside reinforcing layer 212 are formed thereon.

An electroluminescence layer is typical of the light emitting layers 60, which includes carrier injecting layers or carrier transporting layers such as a hole injecting layer, a hole transporting layer, an electron injecting layer, and an electron transporting layer. In addition, the light emitting layer may include a hole blocking layer and an electron blocking layer.

In case of a so-called top emission type EL display device, the emitted light is taken out from the gas barrier layer 30 opposed to the substrate 20. Accordingly, any one of a transparent substrate and an opaque substrate can be used as the substrate 20 constituting the base member 200. Examples of the opaque substrate can include a substrate obtained by performing an insulation process such as surface oxidation on a metal sheet made of ceramics such as alumina, stainless steel, the like, or thermosetting resin or thermoplastic resin, and films thereof (plastic films).

In case of a so-called bottom emission type EL display device, the emitted light is taken out from the substrate 20. Accordingly, a transparent substrate or a translucent substrate is employed as the substrate 20. Examples thereof can include glass, quartz, and resin substrates (plastics, plastic films) and specifically the glass substrate can be suitably used. In the present embodiment, since the top emission type in which the emitted light is taken out from the gas barrier layer 30 is supposed, the opaque substrate such as an opaque plastic film is used as the substrate 20.

A circuit unit 11 including the driving TFTs 123 for driving the pixel electrodes 23 is formed on the substrate 20 and a plurality of light emitting elements (organic EL elements) are formed thereon. Each light emitting element is constructed by sequentially forming the pixel electrode 23 serving as a positive electrode, a hole transporting layer 70 for injecting and transporting holes from the pixel electrode 23, the light emitting layer 60 including the organic EL material, and the negative electrode 50.

In this construction, the holes injected from the hole transporting layer 70 and the electrons from the negative electrode 50 are coupled to each other in the light emitting layer 60, thereby allowing the light emitting element to emit light.

Since the top emission type is supposed in the present embodiment, the pixel electrode 23 is not necessarily transparent and thus can be made of a proper conductive material.

For example, polythiophene derivatives, polypyrrole derivatives, or doped materials thereof can be used as the material for forming the hole transporting layer 70. Specifically, by depositing and drying a dispersion solution in which 3,4-polyethylenedioxythiophene/polystyrenesulfonic acid (PEDOT/PSS) is dispersed in water, the hole transporting layer 70 can be formed.

Well-known light emitting materials which can emit fluorescent light or phosphorescent light can be used as the material for forming the light emitting layer 60. Specifically, (poly) fluorine derivatives (PF), (poly) paraphenylene derivatives (PPV), polyphenylene derivatives (PP), polyparaphenylene derivatives (PPP), polyvinylcarbazole (PVK), polythiophene derivatives, polysilanes such as polymethylphenylsilane (PMPS) can be suitably used.

The high molecular materials may be doped with high molecular materials such as perylene pigment, coumarin pigment, rhodamine pigment or low molecular materials such as rubrene, perylene, 9,10-diphenylanthracene, tetraphenylbutadiene, nile red, coumarin 6, quinacridone for use.

Well-known low molecular materials may be used instead of the above-mentioned high molecular materials.

An electron transporting layer may be formed on the light emitting layer 60 as needed.

In the present embodiment, as shown in FIGS. 3 and 4, the hole transporting layer 70 and the light emitting layer 60 are surrounded with a lyophilic control layer 25 (not shown) and an organic barrier layer (barrier) 221 formed in a lattice shape on the base member 200 and the hole transporting layer 70 and the light emitting layer 60 surrounded therewith serve as an element layer constituting a single light emitting element (organic EL element).

The angle of the walls of the opening portions 221a of the organic barrier layer 221 with respect to the surface of the base member 200 is in the range of 110° to 170°. This is because the light emitting layers 60 can be easily disposed inside the openings 221a when the light emitting layers 60 are formed through a wet process.

As shown in FIGS. 2 to 4, the negative electrode 50 has an area greater than the total area of the actual display area 4 and the dummy area 5 so as to cover them. The negative electrode is formed on the base member 200 so as to the top surfaces of the light emitting layers 60 and the organic barrier layer 221 and the walls forming the outer side of the organic barrier layer 221. As shown in FIG. 4, the negative electrode 50 is connected to a negative-electrode line 202 formed on the outer circumferential portion of the base member 200 at the outside of the organic barrier layer 221. The negative-electrode line 202 is connected to a flexible substrate 203 and thus the negative electrode 50 is connected to a driving IC (driving circuit) not shown on the flexible substrate 203 through the negative-electrode line 202.

Since the top emission type is supposed in the present embodiment, the material for forming the negative electrode 50 needs to have a light transmitting property, and thus a transparent conductive material is used. ITO (Indium Tin Oxide) is suitable as the transparent conductive material, but an indium oxide and zinc oxide amorphous transparent conductive film (Indium Zinc Oxide: IZO (registered trademark)) may be used. The use of ITO is supposed in the present embodiment.

A material having a great electron injection effect is suitable used for the negative electrode 50. Examples thereof can include calcium, magnesium, sodium, lithium metal, and metal compounds thereof. Metal fluorides such as calcium fluoride, metal oxides such as lithium oxide, and organic metal complex such as acetylaceto sodium calcium can be used as the metal compounds. Since the materials have a great electric resistance and thus serves as an electrode, it is preferable that the electric resistance is reduced by forming and patterning a metal layer made of aluminum, gold, silver, or copper only on non-pixel regions or stacking a transparent ITO layer and a metal oxide conductive layer. In the present embodiment, the stacked layer of lithium fluoride, magnesium-silver alloy, and ITO are adjusted to a thickness providing transparency for use.

As shown in FIGS. 3 and 4, a negative electrode protecting layer (electrode protecting layer) 55 is formed on the negative electrode 50. The negative electrode protecting layer 55 is disposed so as to prevent corrosion or damage of the negative electrode 50 in the manufacturing process due to organic solvent or residual moisture at the time of forming the organic buffer layer 210.

It is preferable that the negative electrode protecting layer 55 is made of a material little causing compression stress after it is formed, more preferably, inorganic compound such as silicon compound or metal compound such as titanium oxide.

The negative electrode protecting layer 55 is formed by the use of a high-density plasma method or a vacuum deposition method. The thickness thereof is preferably 30 to 200 nm.

The negative electrode protecting layer 55 covers the negative electrode so as to come in contact with the insulating layer 284 on the outer circumferential portion of the base member 200 and is formed with a thickness of 30 to 200 nm.

As shown in FIGS. 2 to 4, the organic buffer layer 210 is formed on the negative electrode protecting layer 55 so as to cover the negative electrode 50 in the range wider than that of the organic barrier layer 221. The organic buffer layer 210 may cover the negative electrode 50 formed on the pixel part 3 and may cover the negative electrode 50 formed on the negative-electrode line 202 on the outer circumferential portion of the base member 200.

The organic buffer layer 210 is disposed to fill unevenness of the negative electrode 50 formed in an uneven shape due to influence by the shape of the organic barrier layer 221 and is formed such that the top surface is approximately flat. The organic buffer layer 210 has a function of alleviating stress generated due to the warping of the base member 200 or volume expansion thereof and preventing the detachment of the negative electrode 50 from the unstable organic barrier layer 221. Since the top surface of the organic buffer layer 210 is approximately flattened, the gas barrier layer 30 including a hard film formed on the organic buffer layer 210 is also flattened. Accordingly, the portions on which the stress is concentrated disappear and thus it is possible to prevent the generation of crack in the gas barrier layer 30.

High molecular materials having a lipophilic property and a low absorption property such as polyolefin or polyester are suitable as the material for forming the organic buffer layer 210. Further, organic silicon polymers obtained by hydrolyzing and concentrating alkoxy silane such as methyltrimethoxy silane or tetraethoxy silane may be used. High molecular derivatives obtained by using acrylpolyol or methacrypolyol, polyesterpolyol, or polyeterpolyol, polyurethanepolyol as a major component and polymerizing isocyanate compounds such as tolyrenediisocyanate or xylenediisocyanate, or high molecular derivatives obtained by polymerizing dicarbon acid anhydride compound or amine compound with bisphenol epoxy compound may be employed.

By using polymers including silicon compound such as a silane coupling agent such as 3-aminopropyltrimethoxysilane or 3-glycydoxypropyltrimethoxysilane, it is possible to improve the adhesion of the interface with the inorganic material for the negative electrode 50 or the gas barrier layer 30.

A material cured at a low temperature is suitable as the material for forming the organic buffer layer 210 and ultraviolet curable resin containing methacrylate resin or epoxy resin as a major component may be used. By using the ultraviolet curable resin, the organic buffer layer 210 can be formed without heating and thus it is possible to prevent the bad influence of the heating on the light emitting layers 60. In this case, it is preferable that the negative electrode protecting layer 55 is made of a material absorbing ultraviolet rays. For example, by using an oxide semiconductor material having an energy band gap of 2 to 4 eV such as titanium oxide or zinc oxide, and indium tin oxide (ITO) as a part of the negative electrode protecting layer, the ultraviolet rays passing through the organic buffer layer 210 can be absorbed by the negative electrode protecting layer 55, thereby preventing the bad influence of the ultraviolet rays irradiated to the organic buffer layer 210 on the light emitting layers 60. Additives such as fine particles preventing curing contraction may be added thereto.

The gas barrier layer 30 is formed on the organic buffer layer 210, as shown in FIGS. 2 to 4.

The gas barrier layer 30 serves to prevent the invasion of oxygen or moisture, thereby suppressing deterioration of the negative electrode 50 or the light emitting layers 60 due to oxygen or moisture.

The gas barrier layer 30 is made of, for example, inorganic compound, preferably, silicon compound such as silicon nitride, silicon oxynitride, and silicon oxide. The bas barrier layer need be formed out of a coated layer which is fine and non-defective in order to block gas such as steam, and can be preferably formed by the use of a high density plasma method capable of forming a fine film at a low temperature. In addition to the silicon compound, aluminum oxide, tantalum oxide, titanium oxide, and other ceramics may be used.

The gas barrier layer 30 may have a stacked structure and may have a structure that the concentration of oxygen is continuously or discontinuously varied by making the composition thereof non-uniform.

It is preferable that the thickness of the gas barrier layer 30 is in the range of 30 nm to 1000 nm. When the thickness is less than 30 nm, through holes can be formed partially due to defects of a film or deviation in thickness, thereby damaging the gas barrier property. When the thickness is more than 1000 nm, cracks due to stress may be generated.

Since the top emission type is supposed in the present embodiment, the gas barrier layer 30 need have a light transmitting property. Accordingly, by properly adjusting the material or the thickness thereof, the light transmissivity in the visible domain is, for example, 80% or more in the present embodiment.

As shown in FIGS. 2 to 4, an outside reinforcing layer 212 is formed on the outer circumference of the gas barrier layer 30.

The outside reinforcing layer 212 serves to prevent destruction (generation of cracks) of the gas barrier layer 30 due to stress generated in the outer circumference of the organic buffer layer 210, that is, the side edge thereof. That is, when the organic buffer layer 210 is expanded or contracted by means of thermal deformation, the outside reinforcing layer has a function of reinforcing the outside of the gas barrier layer 30 such that the crack is not generated in the gas barrier layer 30. The outer circumference of the gas barrier layer 30 can be easily reduced in thickness. Furthermore, under a condition of high temperature and high humidity, moisture can be easily concentrated on the outer circumference, from the view point of structure. By covering the outer circumference of the gas barrier layer 30 with the outside reinforcing layer 212, water drops are not attached directly to the gas barrier layer 30. Accordingly, it is possible to effectively prevent water drops from being spread to expand and destroy the gas barrier layer 30.

A resin material such as epoxy resin can be used as the material for forming the outside reinforcing layer 212. By using a material having a low water-shedding property and a low surface energy such as organic compound including fluorine atoms, it is possible to improve a water-resistant property and to prevent extrusion of the protective layer 204 at the time of depositing and forming the protective layer 204 in a liquid phase.

Figure 5:
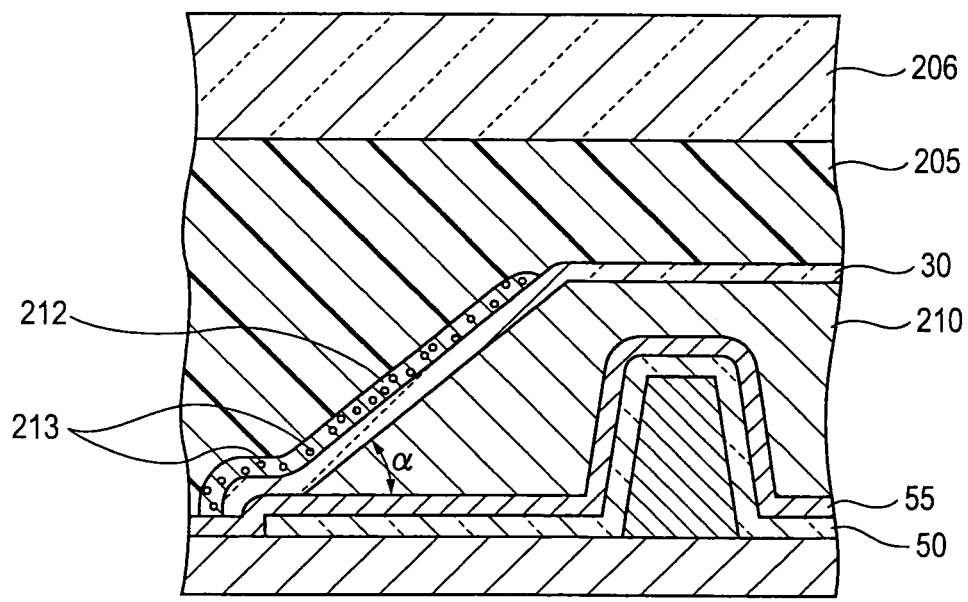
FIG. 5 is an enlarged diagram illustrating an end portion (outer circumferential area) of an organic buffer layer 210.

It is preferable that fine particles 213 are added (included) to the outside reinforcing layer 212 (FIG. 5). By allowing the outside reinforcing layer to include the fine particles 213, it is possible to adjust the fluidity of a resin material forming the outside reinforcing layer 212. In addition, by allowing the outside reinforcing layer to include the fine particles 213, change in volume little occurs at the time of formation of a coated layer or variation in temperature, thereby reducing load on the gas barrier layer 30.

Organic polymer materials or inorganic oxide materials such as polyester, polymethylmethacrylate (PMMA), silica, and alumina are preferably used as the fine particles 213. The fine particles 213 are subjected to a surface process such as a coupling process such as they can be easily melt in the material for the outside reinforcing layer 212.

The organic buffer layer 210 may include the fine particles 213 (see FIG. 5). In this case, the fine particles 213 have particle diameters of 10 nm to 1000 nm and are added to the organic buffer layer 210 with a content of 10% to 70%. Accordingly, the fine particles 213 can enter stepped portions of the opening portions 221a of the organic barrier layer 221, thereby forming an excellent layer without voids. Furthermore, by adding the fine particles 213 having approximately the same diameters, the top surface of the organic buffer layer 210 can be flattened. It is preferable that the content of the fine particles 213 added thereto is greater. However, when the content is greater than 80%, the strength as a layer cannot be maintained. It is preferable that the fine particles 213 include materials having a refractive index n of 1.2 to 2.0. Since the fine particles (for example, silica particles n=1.46) having a refractive index different from that of the organic buffer layer 210 (for example, amorphous polyolefin n=1.53) are chained, optical waveguides can be formed, thereby enhancing the rate of light taken out from the light emitting layers 60.

The diameter of the fine particles 213 need not be uniform and the fine particles may have various diameters. For example, the diameter of the fine particles 213 contained in the outside reinforcing layer 212 may be set to about 1000 nm and the diameter of the fine particles contained in the organic buffer layer 210 may be set to about 10 nm.

Here, the structure of the end portion (outer circumference) of the organic buffer layer 210 will be described with reference to FIG. 5. FIG. 5 is an enlarged vies illustrating the end portion (outer circumference) of the organic buffer layer 210 shown in FIGS. 3 and 4.

The organic buffer layer 210 may be formed on the negative electrode protecting layer 55 and comes in contact with the surface of the negative electrode protecting layer 55 at the end portion thereof with a contact angle α. Here, the contact angle α is preferably 45° or less and more preferably in the range of 1° to 20°.

Since the organic buffer layer 210 is formed in this way, the gas barrier layer 30 or the outside reinforcing layer 212 which is formed on the organic buffer layer 210 has a shape corresponding to the shape of the organic buffer layer 210. Accordingly, since abrupt variation in shape does not occur in the end portion of the gas barrier layer 30 and the shape thereof varies smoothly, it is possible to prevent the generation of defects such as cracks due to the concentration of stress. That is, by disposing the gas barrier layer 30 and the outside reinforcing layer 212 on the organic buffer layer 210, it is possible to more effectively prevent the generation of defects such as cracks due to the concentration of stress in the gas barrier layer 30. In addition, by disposing the gas barrier layer 30 to the outer area of the organic buffer layer 210, it is possible to maintain the sealing ability for a long time.

The outside reinforcing layer 212 is formed to cover the outer circumferential area of the gas barrier layer 30 and not to expose the side edge of the gas barrier layer 30. Since cracks can be easily generated in the outer circumferential area of the gas barrier layer 30, it is possible to more effectively prevent the generation of cracks by reinforcing the area with the outside reinforcing layer 212. In addition, it is possible to prevent the gas barrier layer 30 from being detached from the base member 200.

As shown in FIGS. 3 and 4, the protective layer 204 covering the gas barrier layer 30 is disposed on the gas barrier layer 30. The protective layer 204 includes an adhesive layer (resin adhesive layer) 205 disposed on the side of the gas barrier layer 30 and a surface protecting film (protective film) 206.

The adhesive layer 205 serves to fix the surface protecting film 206 onto the gas barrier layer 30, to buffer the external mechanical impacts, and to protect the light emitting layers 60 or the gas barrier layer 30. Then, the surface protecting film 206 is bonded to the adhesive layer 205 to form the protective layer 204.

The adhesive layer 205 is formed out of an adhesive including a material more flexible and lower in glass transition point than the surface protecting film 206, such as resin obtained by curing a liquid material such as urethane, acryl, epoxy, and polyolefin. The adhesive layer may be formed out of a two-liquid mixture material to which a curing agent is added to cure the adhesive layer at a low temperature.

It is preferable that a silane coupling agent or alkoxy silane is added to the adhesive layer 205. Accordingly, the adhesion property between the adhesive layer 205 and the gas barrier layer 30 is further enhanced and the buffering function against the mechanical impacts is improved.

Specifically, when the gas barrier layer 30 is made of silicon compound, the adhesion property between the adhesive layer 205 and the gas barrier layer can be improved by a silane coupling agent or alkoxy silane and thus enhancing the gas barrier property of the gas barrier layer 30.

It is preferable that fillers is added to (included in) the adhesive layer 205 to adjust an elasticity coefficient.

The surface protecting substrate 206 is provided on the adhesive layer 205 to configure the surface of the protective layer 204 and has at least one of functions such as pressure resistance, abrasion resistance, external light antireflection, gas barrier properties, and ultraviolet barrier properties.

The material of the surface protecting substrate 206 is glass, a diamond-like carbon (DLC) layer, transparent plastic, or a transparent plastic film.

Here, as the plastic material, for example, PET, acryl, polycarbonate, polyolefin is employed. Furthermore, in the surface protecting substrate 206, an optical structure such as an ultraviolet blocking/absorbing layer, a light antireflection layer, a heat radiating layer, a lens, a color wavelength converting (color filter) layer, or a mirror may be provided.

In addition, in the EL display device of this example, in a case of using the top emission type, the surface protecting layer 206 and the adhesive layer 205 need be translucent. However, in a case of using a bottom emission type, the surface protecting layer 206 and the adhesive layer 205 need not be translucent.

Next, a method of manufacturing the EL display device 1 according to the present invention will be described with reference to FIGS. 6 and 7. FIGS. 6 and 7 are cross-sectional views taken along line A-B of FIG. 2.

In addition, in the present embodiment, the EL display device 1 of the light emitting device is a top emission type. Furthermore, a process for forming a circuit unit 11 on the surface of the substrate 20 is similar to the prior art and thus their description will be omitted.

Figure 6A:
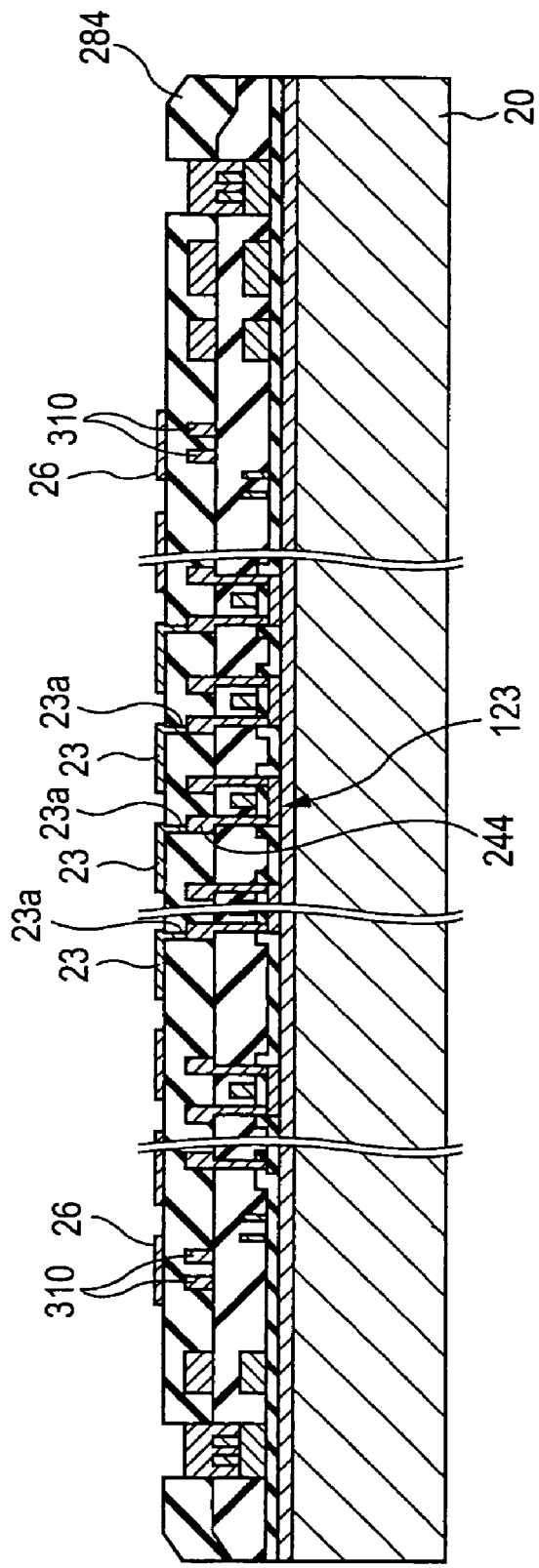
FIG. 6 is a diagram illustrating a method of manufacturing the EL display device 1 in the order of process steps.

First, as illustrated in FIG. 6A, a conductive film, which will become a pixel electrode 23, is formed to cover the entire surface of a substrate 20 having a circuit unit 11 formed on the surface thereof. Furthermore, by patterning this transparent conductive film, the pixel electrode 23 connected with a drain electrode 244 through a contact hole 23a of a second interlayer insulating layer 284 is formed and a dummy pattern 26 of a dummy area is also formed.

Moreover, in FIGS. 3 and 4, the pixel electrode 23 and the dummy pattern 26 are collectively called the pixel electrode 23. The dummy pattern 26 is not connected to an underlying metal wiring through the second interlayer insulating layer 284. In other words, the dummy pattern 26 is disposed in an island shape and has substantially the same shape as that of the pixel electrode 23 formed on an actual display area. Alternatively, the dummy pattern may have a shape different from that of the pixel electrode 23 formed on the display area. In this case, the dummy pattern 26 may be located above at least a driving voltage conducting unit 310 (340).

Figure 6B:
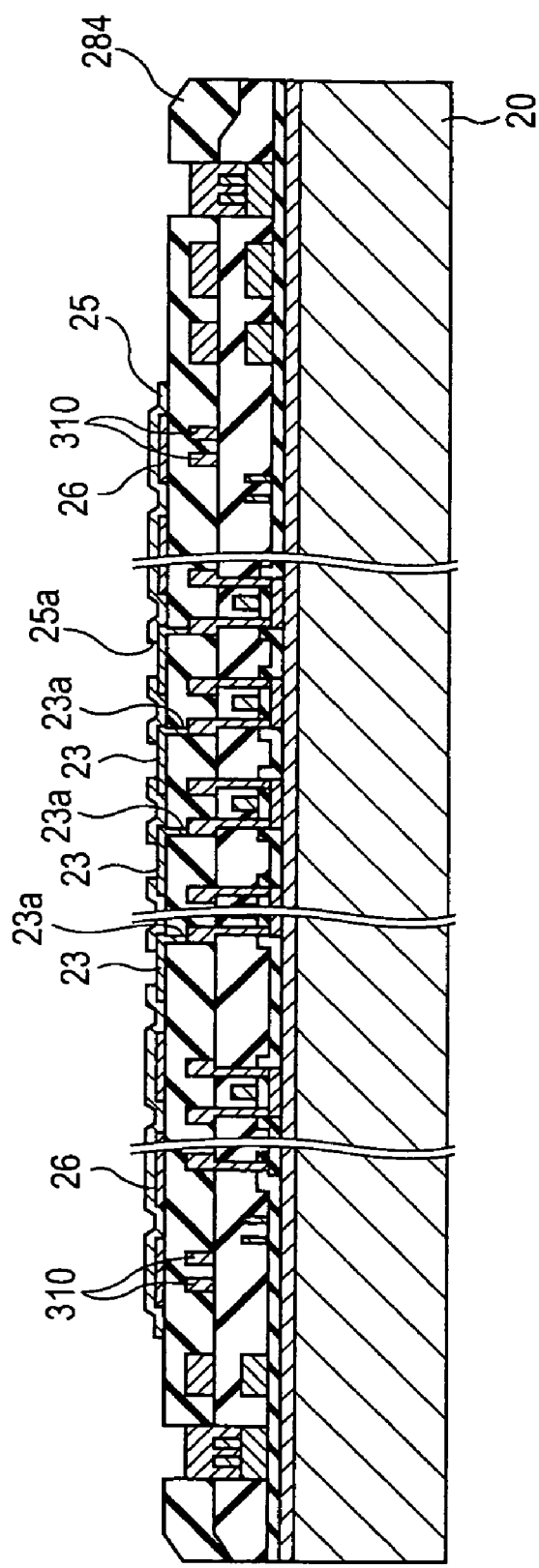

Next, as illustrated in FIG. 6B, a lyophilic control layer 25 is formed on the pixel electrode 23, the dummy pattern 26, and the second interlayer insulating layer. Furthermore, in the pixel electrode 23, the lyophilic control layer 25 is formed such that a portion thereof is opened, and holes in the pixel electrode 23 can move through an opening 25a (see FIG. 3). On the contrary, in the dummy pattern 26 in which the opening 25a is not formed, the insulating layer (lyophilic control layer) 25 functions as a hole movement shielding layer and thus the hole does not move. Subsequently, in the lyophilic control layer 25, a black matrix (BM) (not illustrated) is formed on a concave portion located between two different pixel electrodes 23. In more detail, the concave portion of the lyophilic control layer 25 is formed by a sputtering method using metal chrome.

Figure 6C:
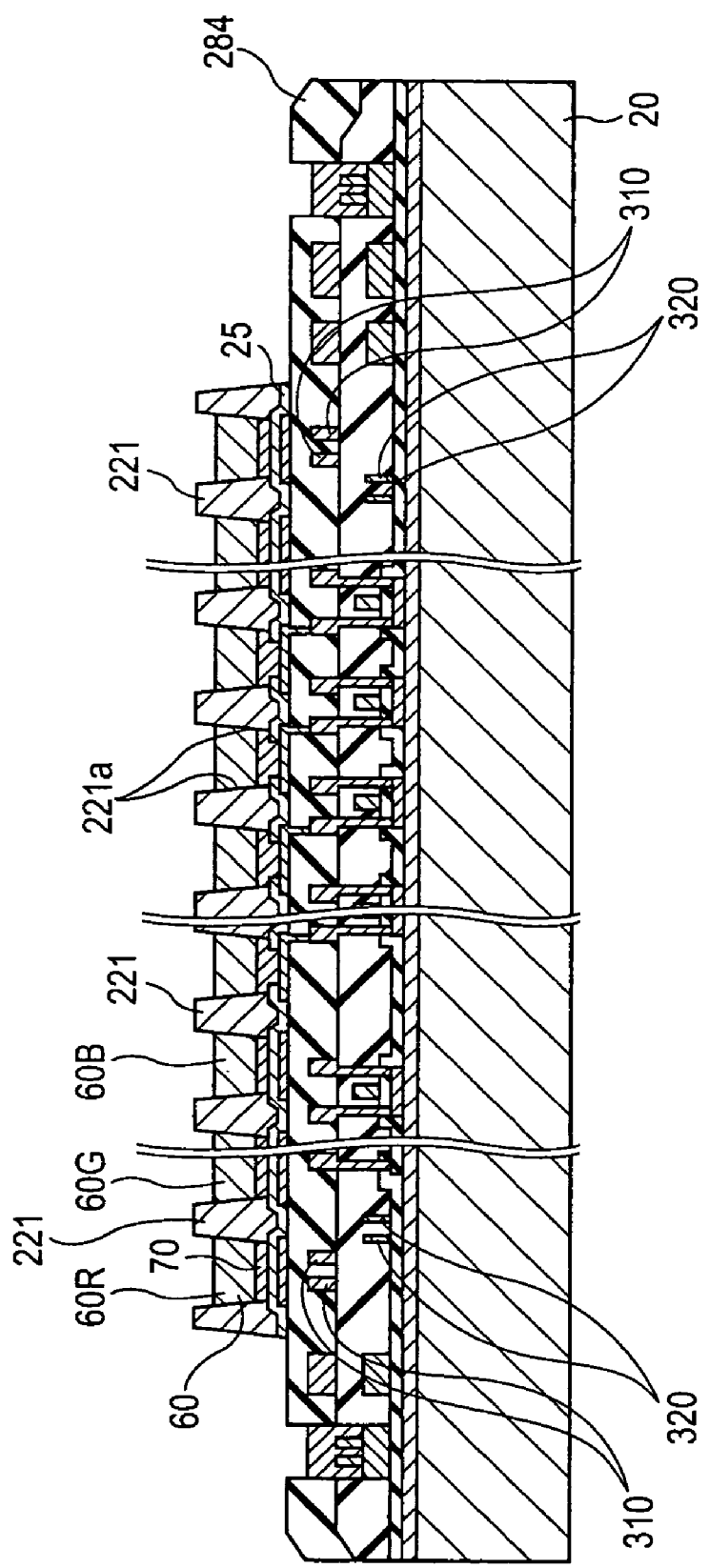

In addition, as illustrated in FIG. 6C, an organic barrier wall layer 221 is formed to cover a specific position of the lyophilic control layer 25, and more particularly, the BM. In a method of forming the organic barrier layer, for example, a material obtained by dissolving resist such as acrylic resin or polyimide resin in a solvent is coated using various coating method such as a spin coating method or a dip coating method to form an organic layer. Furthermore, any material of the organic layer which cannot be dissolved in the below-mentioned solvent of ink and can be apt to be patterned by etching may be used.

Moreover, the organic layer is patterned using a photolithography technology or an etching technology and an opening 221a is formed in the organic layer such that an organic barrier wall layer 221 having a wall surface at the opening 221a is formed. Here, an angle between the wall surface of the opening 221a and the surface of the base member 200 is in a range of 110° to 170°.

In this case, the organic barrier wall layer 221 may be located above at least a driving control signal conducting unit 320.

Next, a lyophilic area and a lyophobic area are formed on the surface of the organic barrier wall layer 221. In the present embodiment, each area is formed by a plasma process. In more detail, the plasma process includes a preheating step, a lyophilic step for allowing the upper surface of the organic barrier wall layer 221, the wall surface of the opening 221a, an electrode surface 23c of the pixel electrode 23, and the upper surface of the lyophobic control layer 25 to be lyophilic, a lyophobic step for allowing the upper surface of the organic barrier wall layer 221 and the wall surface of the opening 221a to be lyophobic, and a cooling step.

Next, a hole transport layer 70 is formed by a hole transport layer forming step. In this hole transport layer forming step, a hole transport layer material is coated on the electrode surface 23c using a liquid droplet discharging method such as an inkjet method or a spin coating method and is then dried and heated, thereby forming the hole transport layer 70 on the electrode 23.

Next, a light emitting layer 60 is formed by a light emitting layer forming step. In this light emitting forming step, a light emitting layer forming material is discharged onto the hole transport layer 70, for example, by the inkjet method and is then dried and heated, thereby forming the light emitting layer 60 in the opening 221a formed in the organic barrier wall layer 221. In the light emitting layer forming step, in order to prevent the hole transport layer 70 to be redissolved, a nonpolar solvent which cannot dissolve the hole transport layer 70 is used as the solvent used in the light emitting layer forming material.

Figure 7A:
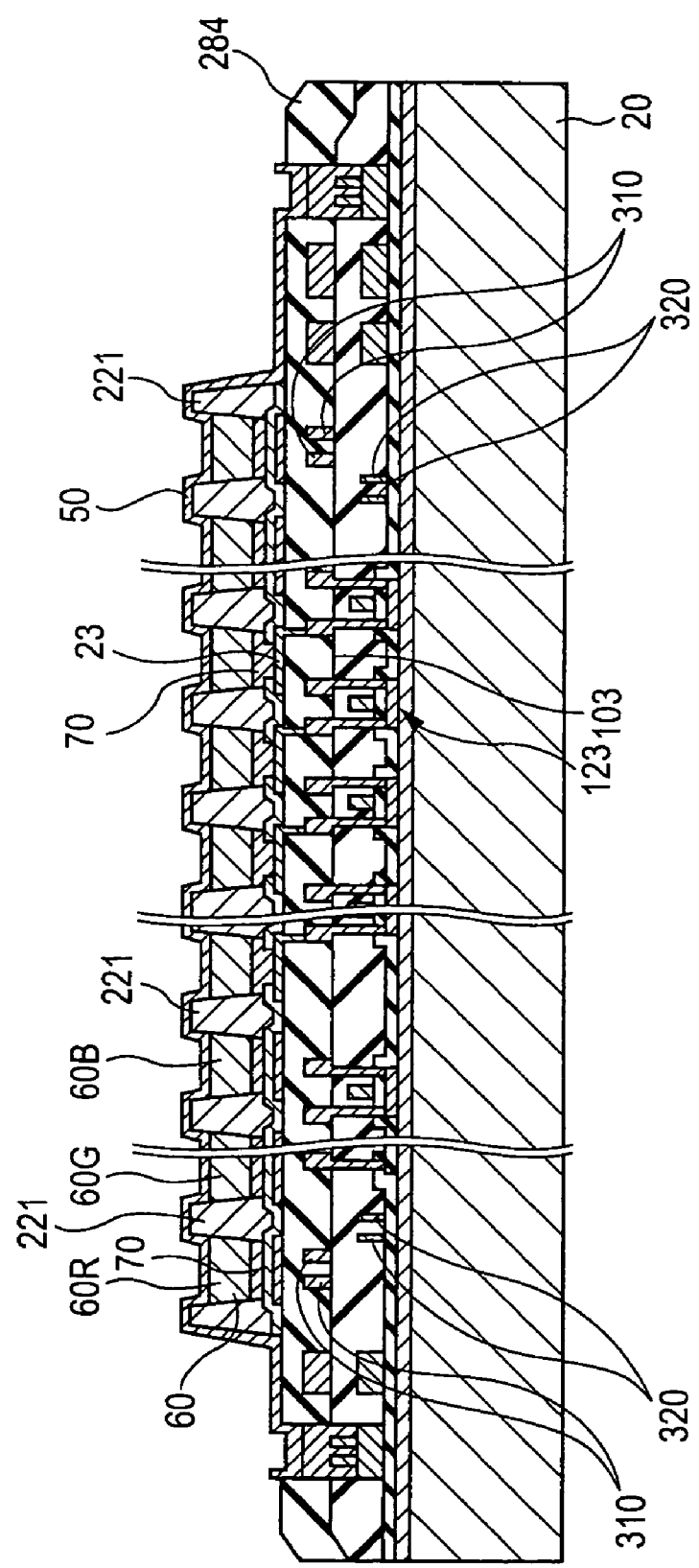
FIG. 7 is a diagram illustrating process steps subsequent to the process steps shown in FIG. 6.

Next, as illustrated in FIG. 7A, a cathode 50 is formed by a cathode layer forming step. In the cathode layer forming step, an electron injecting layer such as lithium fluoride, calcium, or magnesium and a metal oxide conductive layer, such as ITO for lowering an electrical resistance, are formed by a physical vapor deposition method such as a vacuum deposition method or an ion plating method to form the electrode 50. At this time, the cathode 50 is formed to cover the wall surface forming an outer portion of the organic barrier wall layer 221 as well as the upper surfaces of the light emitting layer 60 and the organic barrier wall layer 221. Next, a cathode protective layer 55 made of a silicon nitride or silicon oxynitride is formed on the cathode 50. As a method of forming the cathode protective layer 55, a physical vapor deposition method such as an ion plating method is preferably used.

Figure 7B:
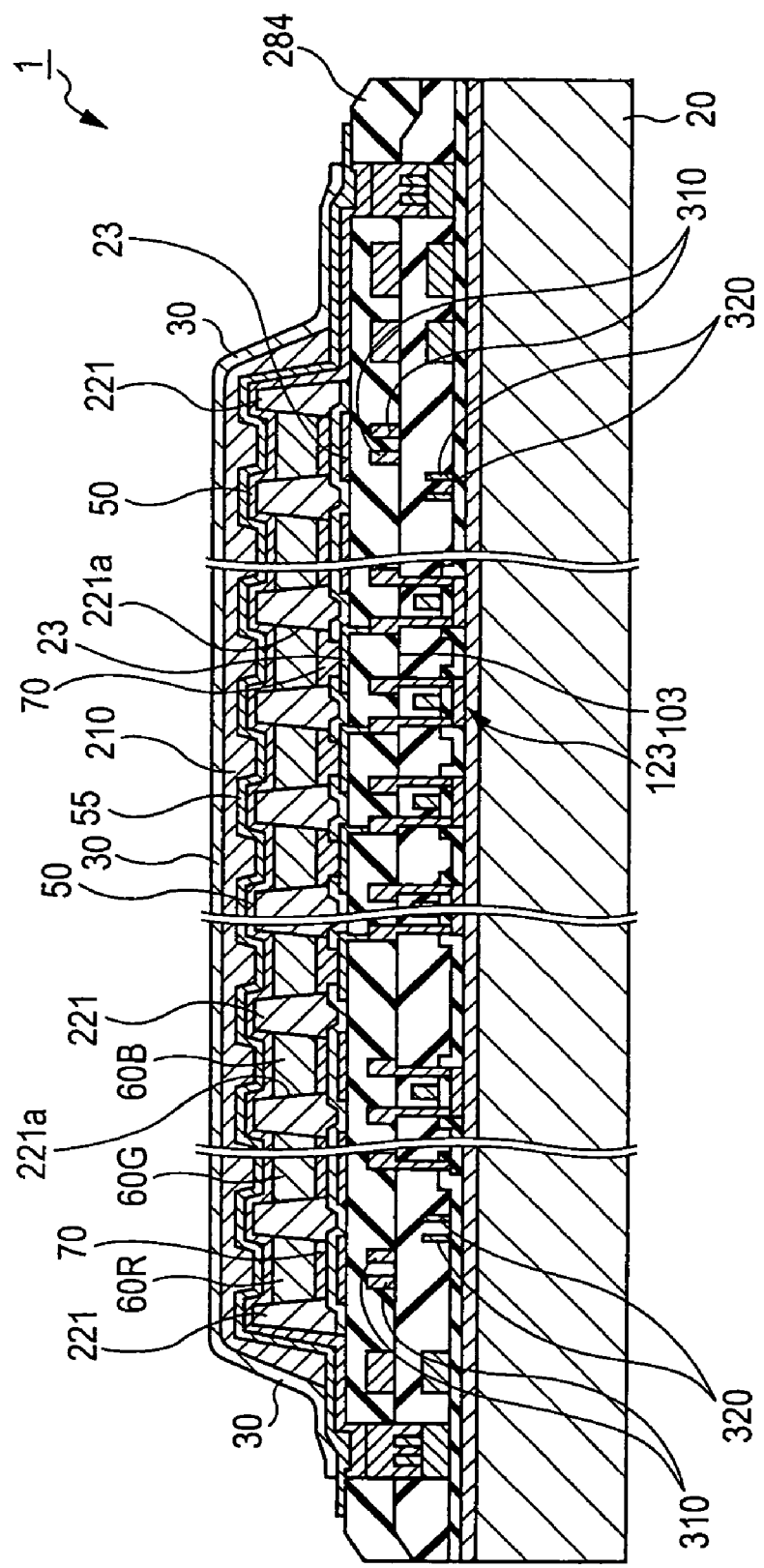

Next, as illustrated in FIG. 7B, an organic buffer layer 210 is formed by a liquid phase method, that is, a wet process.

As a method of forming the organic buffer layer 210, a method such as an inkjet method, a slit coating method, a curtain coating method, a screen printing method, or a flexographic printing method may be employed. In addition, in order to prevent a film defect due to air bubble from being generated, the coating atmosphere is reduced pressure atmosphere in a range of 100 to 1000 Pa, and, for example, a screen printing method is preferably under the reduced pressure atmosphere.

Furthermore, in order to have both the flatness and the patterning, the viscosity of the organic buffer layer 210 at the time of coating is preferably 100 to 10000 mPa·s. In order to form the organic buffer layer 210 under the reduced pressure atmosphere, a diluted solver which is apt to be volatile is not used and a material polymerized by cross-linking all the coating materials is preferably used.

A contact angle α between the pattern end of the organic buffer layer 210 and the cathode protective layer 55 can become smaller in accordance with the viscosity control and the coating method. The film thickness of the organic buffer layer 210 need be thicker than the height of the barrier wall layer or the pixel barrier wall because the organic buffer layer 210 reduces stress generated by irregularities and realizes the flatness. For example, the film thickness of the organic buffer layer 210 is preferably 2 to 10 μm. It is preferable that the stress is not generated, but tension may be slightly generated. In order to remarkably reduce the stress, a porous film having a low elasticity modulus of 10 Gpa or less is preferably used and the density thereof is in a range of 0.8 to 1.8 g/cm$^3$.

After coating the organic buffer layer 210, hardening is performed at a heating temperature of 50 to 80° C. under the reduced pressure atmosphere an inert gas atmosphere or nitrogen or the like, while preventing moisture from being absorbed.

The heating allows the viscosity to temporarily be lowered to obtain fluidity, in addition to the hardening. Thus, the flatness of the surface is improved and a taper angle of the pattern end is adjusted to a desired angle. In other words, the contact angle α between the pattern end of the organic buffer layer 210 and the cathode protective layer 55 can be in a range of 1 to 20°. Thereafter, in order to prevent moisture from being absorbed, the atmosphere does not return to atmospheric pressure atmosphere and returns to vacuumed atmosphere again. Then, a process for forming a gas barrier layer 30 is preferably performed.

Next, the gas barrier layer 30 is formed to cover the organic buffer layer 210. The gas barrier layer 30 is preferably a transparent thin film mainly made of silicon nitride or silicon oxynitride, which is formed by high density plasma forming method in the state of the reduced pressure. Furthermore, in order to completely block vapor having small molecules, the gas barrier layer 30 preferably has closeness and slight compression stress. It is preferable that the film density is 2.3/cm$^3$ or more, and the elasticity modulus is 100 Gpa. It is preferable that the film thickness thereof is 1000 nm or less together with an inorganic buffer layer and more particularly 50 to 500 nm.

In a method of forming the gas barrier layer 30, a film is first formed by a physical vapor deposition method such as a sputtering method or an ion plating method and a film is then formed by a chemical vapor deposition method such as a plasma CVD method. The physical vapor deposition method such the sputtering method or the ion plating method is suitable for forming the gas barrier layer 30 because it can obtain a film having relatively superior closeness. The chemical vapor deposition method is suitable for forming the gas barrier layer 30 because it can obtain a good film having low stress, superior step coverage, low defect, and closeness. These methods can be timely selected in consideration of mass productivity.

In addition, the gas barrier layer 30 is successively formed in the vacuumed atmosphere, without returning the atmospheric pressure atmosphere after forming the organic buffer layer 210.

The gas barrier layer 30 may be formed by a single layer using the same material, as mentioned above, or by laminating a plurality of layers using different materials. Furthermore, the gas barrier layer 30 may be formed by a signal layer, of which the composition is continuous or non-continuous in a film thickness direction.

Figure 7C:
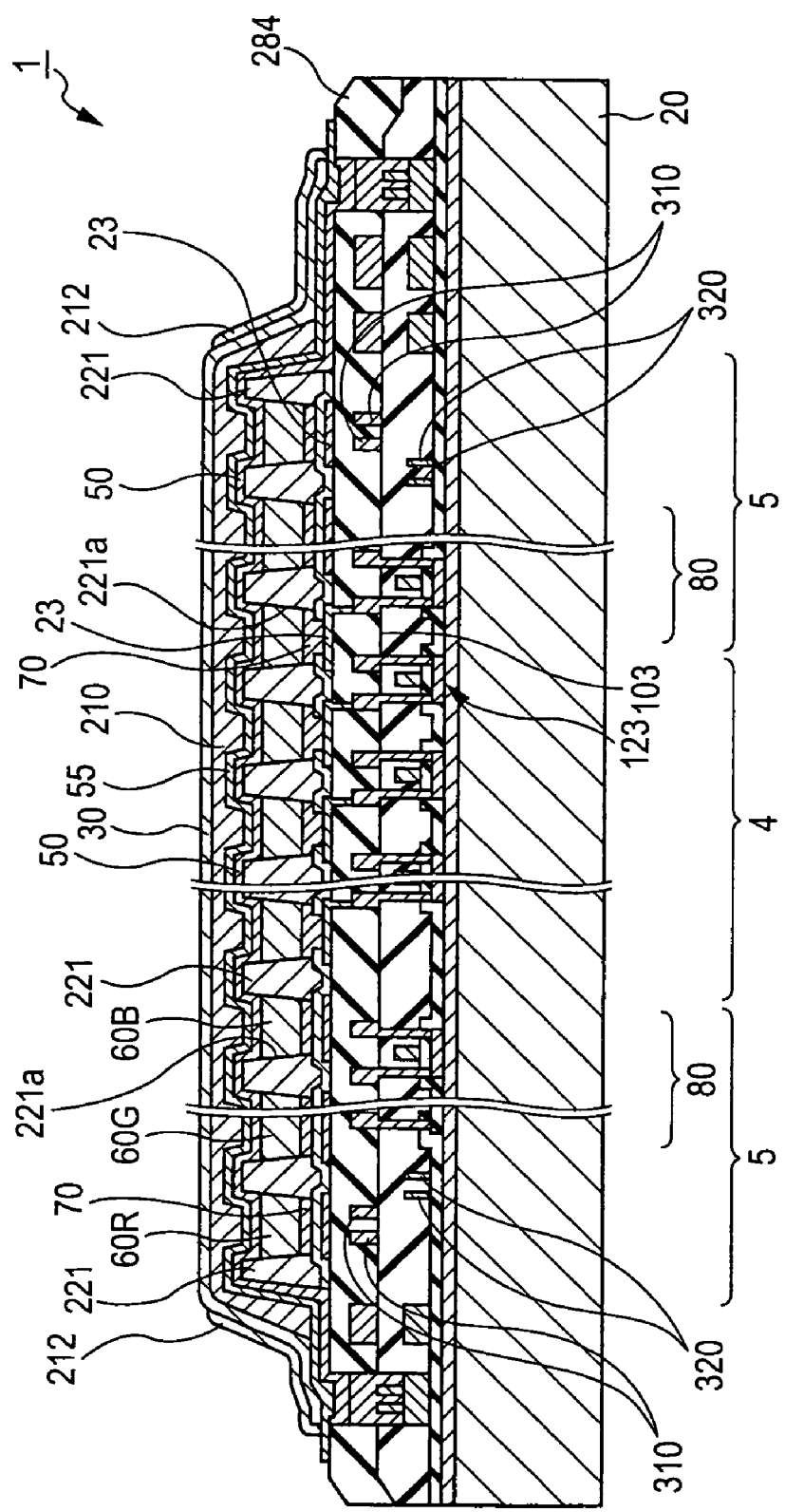

In addition, as illustrated in FIG. 7C, an outside reinforcing layer 212 is formed to cover an outer area (or entire surface) of the gas barrier layer 30. The outside reinforcing layer 212 is formed by a liquid phase method, that is, a wet process, similar to the method of forming the organic buffer layer 210. Furthermore, a method such as a slit coating method, a curtain coating method, a screen printing method, a flexographic printing method, a dispense method due to a nozzle discharge may be employed.

Furthermore, since the outside reinforcing layer 212 is disposed at the outer area of the gas barrier layer 30 of which the shape is slowly changed, the viscosity of the outside reinforcing layer 212 at the time of coating is high, for example, 1000 mPa·s. It is preferable that a resin material is epoxy resin or fluorine-containing resin which is hardened at a relatively low temperature and has superior water resistance. The resin material may be two-liquid mixing type containing hardening component such as dicarboxylic anhydride or amine compound. In order to increase the viscosity, minute particles 213 are contained in a material for forming the outside reinforcing layer 212.

The film thickness of the outside reinforcing layer 212 is preferably, for example, in a range of 5 to 100 µm. However, in case of simultaneously covering a structure such as a mounted connection terminal, the outside reinforcing layer may have a film thickness which can cover the structure.

The outside reinforcing layer 212 is hardened at a heating temperature of 50 to 80° C. under the atmospheric pressure atmosphere, since the gas barrier already exists.

Next, a protective layer 204 composed of an adhesive layer 205 and a surface protecting substrate 206 is formed on the gas barrier layer 30 and the outside reinforcing layer 212 (see FIGS. 3 and 4).

The adhesive layer 205 is uniformly coated on the gas barrier layer 30 and the outside reinforcing layer 212 using a screen printing method or a slit coating method, and a surface protecting substrate 206 is attached thereon.

When the protective layer 204 is formed on the gas barrier layer 30 and the outside reinforcing layer 212, since the surface protecting substrate 206 has functions such as pressure resistance, abrasion resistance, light antireflection, gas barrier properties, and ultraviolet barrier properties, the light emitting layer 60, the cathode 50, or even the gas barrier layer 30 and the outside reinforcing layer 212 can be protected by the surface protecting substrate 206. Thus, the life span of the light emitting device can increase.

Furthermore, since the adhesive layer 205 performs a buffer function for mechanical impact, when the mechanical impact is externally applied, the mechanical impact to the gas barrier layer 30 or the light emitting device formed therein is relaxed and thus the functional deterioration of the light emitting device due to the mechanical impact can be prevented.

As mentioned above, the EL display device 1 is formed.

Figure 8:
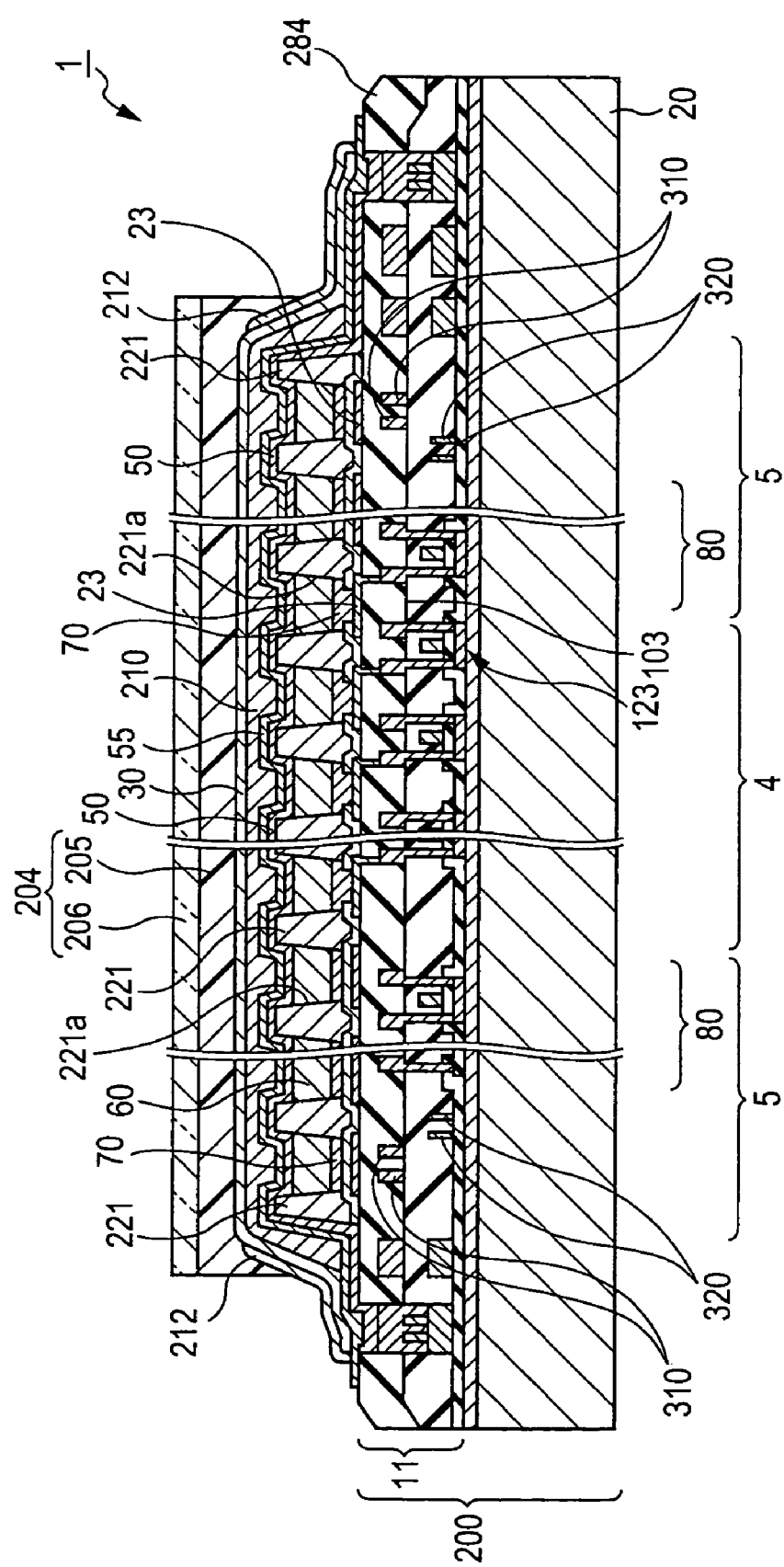
FIG. 8 is a cross-sectional view illustrating a modified example of a protective layer 204.

FIG. 8 is a cross-sectional view illustrating a modified example of a protective layer 204.

An area for forming the protective layer 204 composed of the adhesive layer 205 and the surface protecting substrate 206 need not entirely cover the gas barrier layer 30 and the outside reinforcing layer 212. It is preferable that the adhesive layer 205 slightly overlaps the outside reinforcing layer 212. As illustrated in FIG. 8, the protective layer is formed such that the outside reinforcing layer 212 is exposed to the outer area.

In a case where the surface protecting substrate 206 is obtained by dividing (scribing) a large-sized mother substrate in plural, it is possible to obtain more surface protecting substrate 206 from one mother substrate 208.

In particular, although the mother substrate 208 is cut and divided after disposing the mother substrate 208 on the adhesive layer 205, since the outside reinforcing layer 212 buffers the mechanical impact to the gas barrier layer 30 or the light emitting device formed therein, it is possible to prevent the gas barrier layer 30 from being cracked or the function of the light emitting device from being deteriorated.

Here, a method of cutting and dividing the large-sized mother substrate 208 in plural to obtain the surface protecting substrate 206 will be simply described.

FIG. 9 is a diagram illustrating a method of scribing a mother substrate 208.

Figure 9A:
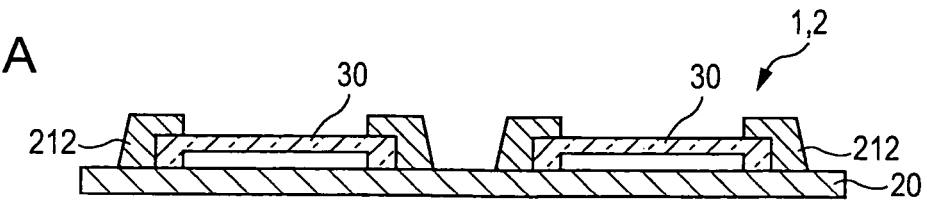
FIG. 9 is a diagram illustrating a method of scribing a mother substrate 208.

As illustrated in FIG. 9A, a plurality of EL display devices 1 and 2 are formed on the large-sized base member 200. On the EL display devices 1 and 2, the outside reinforcing layer 212 is formed to cover the outer circumferential area of the gas barrier layer 30.

Figure 9B:
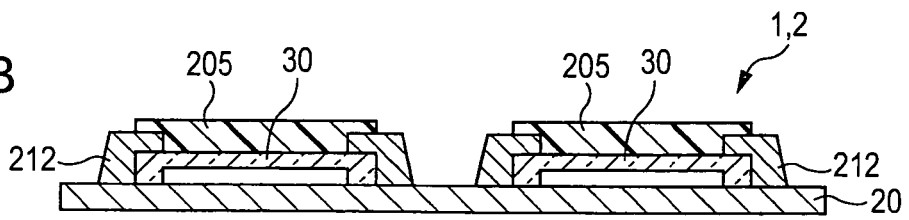

In addition, as illustrated in FIG. 9B, the adhesive layer 205 is coated to cover the gas barrier layer 30. At this time, the adhesive layer 205 is coated to cover a portion of the outside reinforcing layer 212 such that the gas barrier layer 30 is not exposed.

Figure 9C:
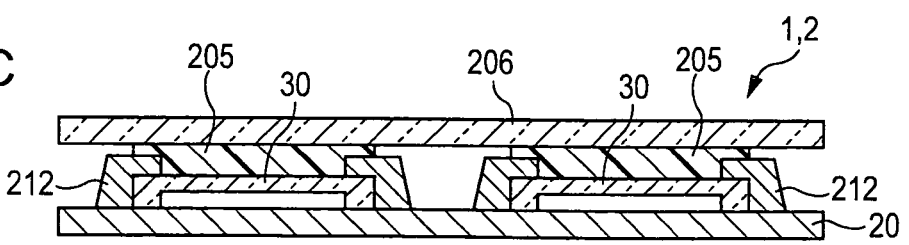

Next, as illustrated in FIG. 9C, on the plurality of EL display devices 1 and 2 formed on the large-sized base member 200, the large-sized mother substrate 208 is disposed. In addition, in this state, the adhesive layer 205 is hardened.

Figure 9D:
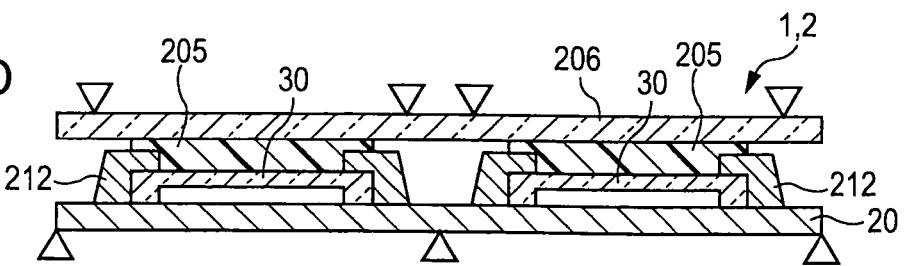
Figure 9E:
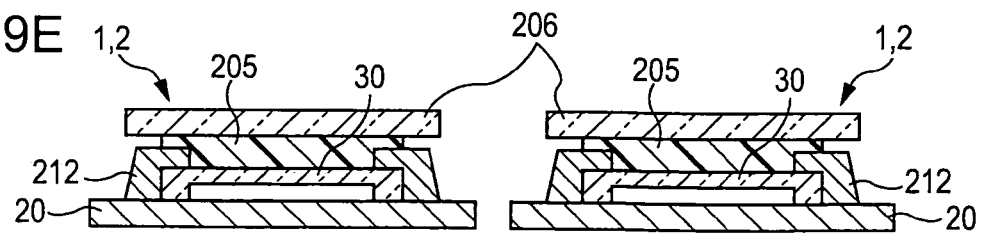

Furthermore, as illustrated in FIG. 9D, the large-sized base member 200 and the large-sized mother substrate 208 are cut and divided at a specific position. At this time, the large-sized mother substrate 208 is cut and divided along substantially the outer circumference of the adhesive layer 205 (by pressing a cutter at portions indicated by triangular marks). Thus, as illustrated in FIG. 9E, the plurality of EL display devices are obtained.

Since the surface protecting substrate 206 becomes narrower (is formed in a narrower range than that of the gas barrier layer 30), the frame width of the large-sized mother substrate 208 can become narrower. Accordingly, it is possible to more obtain the surface protecting substrates 206 from one large-sized mother substrate 208. Furthermore, since, at the time of scribing the mother substrate 208, the adhesive layer 205 and the outside reinforcing layer 212 buffers the mechanical impact to the gas barrier layer 30 or the light emitting device formed therein, good scribe can be realized without damaging the gas barrier layer 30 or the light emitting device.

SECOND EMBODIMENT

Hereinafter, an EL display device 2 according to a second embodiment of the present invention will be described. In the present embodiment, the same structures as that of the first embodiment are denoted by the same reference numerals and thus their description will be omitted.

Figure 10:
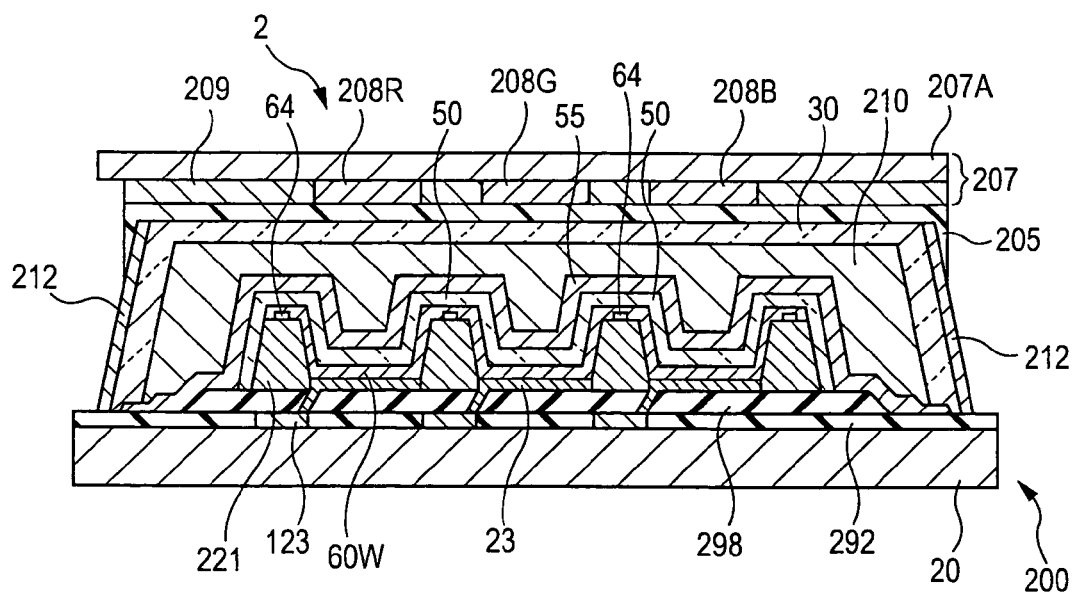
FIG. 10 is a schematic cross-sectional view illustrating a sectional structure of an EL display device 2 according to a second embodiment of the invention.

FIG. 10 is a schematic cross-sectional view illustrating a sectional structure of an EL display device 2 according to a second embodiment of the invention.

The EL display device 2 is different from the EL display device 1 of the first embodiment in that a white light emitting layer which emits white light is employed as the light emitting layer and a color filter substrate 207 is employed as the surface protecting substrate.

As the white organic light emitting material, a styryl amine light emitting material, anthracene dopamine (blue), or styryl amine light emitting material, or rubrene dopamine (yellow) is used.

In addition, a triarylamine (ATP) multimeric complex hole injecting layer, a triphenylediamine (TDP) hole transport layer, an aluminum quinolinol (Alq3) layer (electron transport layer), and a LiF layer (electron injecting buffer layer) are preferably formed above or below the white light emitting layer 60W.

In addition, similar to the EL display device of the first embodiment, since a light emitting layer 60 need not be divided by R, G, and B, the white light emitting layer 60W may be formed on the pixel electrode 23 over the organic barrier wall layer 221.

Moreover, a subsidiary electrode 64 may be disposed on the upper surface of the organic barrier wall layer 221. The subsidiary electrode 64 has a resistance value lower than that of the cathode 50 and is electrically connected to a middle portion of the cathode 50, thereby preventing the voltage of the cathode 50 having a high resistance value from being dropped.

In addition, the color filter substrate 207 includes a red color layer 208R, a green color layer 208G, a blue color layer 208B, and a black matrix 209 formed on a main substrate 207A. Furthermore, the surface for forming the color layers 208R, 208G, and 208B and the black matrix 209 face the base member 200 through the adhesive layer 205. The material of the main substrate 207A may be same as that of the surface protecting substrate 206 of the first embodiment.

Moreover, each of the color layers 208R, 208G, and 208B faces the white light emitting layer 60W on the pixel electrode 23. Thus, the light emitted from the white light emitting layer 60W transmits the color layers 208R, 208G, and 208B to emit the light as the respective color light such as red light, green light, and blue light to the side of a viewer.

In the EL display device 2, the multi-color display is performed by the color filter substrate 207 having the plurality of color layers 208 using the light emitted from the white light emitting layer 60W.

In addition, the distance between the color layer 208R, 208G, and 208B and the white light emitting layer 60W is as short as possible such that the light emitted from the white light emitting layer 60W is emitted to only the facing color layer. This is because, when the distance is long, a probability that the light emitted from the white light emitting layer 60W is emitted to an adjacent color layer becomes higher. In order to suppress this problem, the distance is preferably short.

In more detail, the distance from the surface of an insulating layer 284 to the color filter substrate 207 is preferably 15 μm. Thus, the light emitted from the white light emitting layer 60W is emitted to only the facing color layer and thus the emitted light can be suppressed from being leaked to the adjacent color layer. Accordingly, it is possible to suppress color mixing.

Furthermore, since a single-color white light emitting layer 60W is used, the light emitting layer need not be formed in each of the R, G, and B. In particular, in a mask deposition process for forming a low molecular white light emitting layer or a liquid droplet discharging process for forming a high molecular white light emitting layer, since one kind of white light emitting layer can be formed in one process, the manufacturing process is more facilitated compared with the case of forming the light emitting layer in each of the R, G, and B. In addition, the difference between the life spans of the light emitting layers 60 can be suppressed.

Moreover, even in the EL display device 2, the outside reinforcing layer 212 is formed on the outer circumferential area (or the entire surface) of the gas barrier layer 30.

In addition, a protective layer 204 composed of an adhesive layer 205 and a surface protecting substrate 206 is formed on the gas barrier layer 30 and the outside reinforcing layer 212. As an area for forming the protective layer 204, the outer circumferential area of the outside reinforcing layer 212 may be exposed.

Accordingly, it is possible to more obtain the surface protecting substrates 206 from one large-sized mother substrate 208. In particular, although the mother substrate 208 is scribed after disposing the mother substrate 208 on the adhesive layer 205, since the adhesive layer 205 and the outside reinforcing layer 212 buffers the mechanical impact to the gas barrier layer 30 or the light emitting device formed therein, it is possible to prevent the gas barrier layer 30 from being cracked or the function of the light emitting device from being deteriorated.

Furthermore, although, in the EL display devices 1 and 2 of the embodiments, the top emission type is described, the present invention is not limited to these embodiments. In other words, the present invention may apply to a bottom emission type or a type for emitting the light at the both sides.

In a case of using the bottom emission type or the type for emitting the light at the both sides, it is preferable that a switching TFT 112 or a driving TFT 123 formed in the base member 200 is formed just under the lyophilic control layer 25 and the organic barrier wall layer 221, not just under the light emitting device, thereby increasing an aperture ratio.

Furthermore, although, in the EL display devices 1 and 2, the first electrode functions as the anode and the second electrode functions as the cathode, the first electrode may function as the cathode and the second electrode may function as the anode. In this case, the position of the light emitting layer 60 and the hole transport layer 70 need be changed.

Moreover, although, in the present embodiments, the EL display devices 1 and 2 apply to the light emitting device, the present invention is not limited to these embodiments. If the second electrode is provided at the outside of the base member, the present invention may apply to any type of light emitting device.

Next, an electronic apparatus according to the present invention will be described.

The electronic apparatus has the above-mentioned EL display devices 1 and 2 as a display unit, as illustrated in FIG. 11.

Figure 11A:
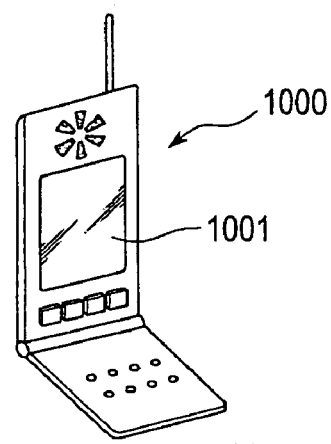
FIG. 11 is a diagram illustrating an electronic apparatus according to an embodiment of the invention.

FIG. 11A is a perspective view illustrating an example of a mobile phone. In FIG. 11A, the mobile phone 1000 includes a display unit 1001 using the above-mentioned EL display device 1.

Figure 11B:
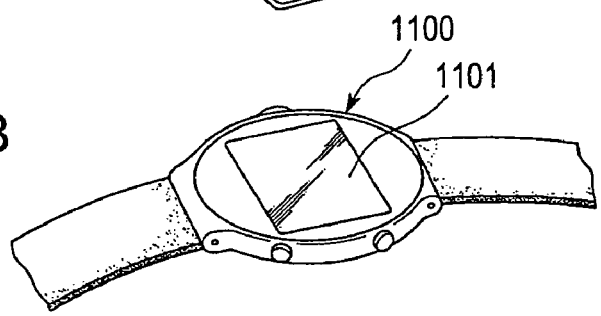

FIG. 11B is a perspective view illustrating an example of a wristwatch type electronic apparatus. In FIG. 11B, the watch 1100 includes a display unit 1101 using the above-mentioned EL display device 1.

Figure 11C:
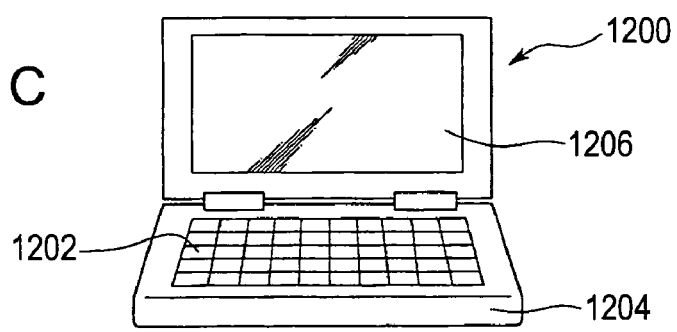

FIG. 11C is a perspective view illustrating an example of a portable information processing apparatus such as a word processor or a personal computer. In FIG. 11C, the information processing apparatus 1200 includes an input unit 1202 such as a keyboard, a display unit 1206 using the above-mentioned EL display device 1, and an information processing apparatus casing 1204.

Figure 11D:
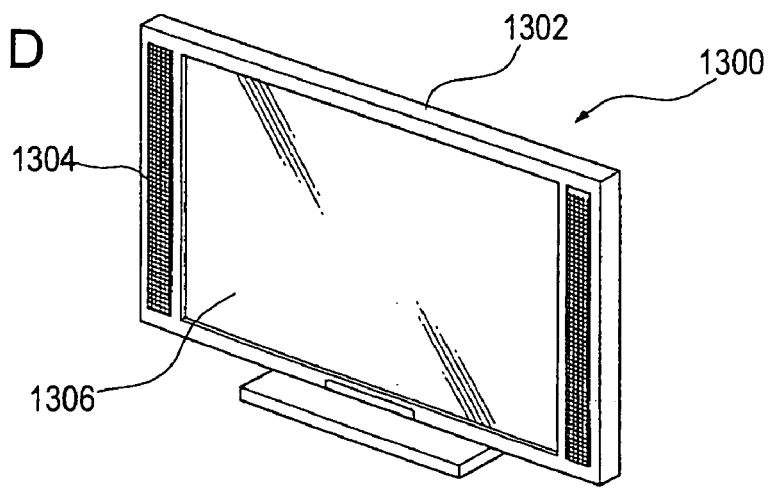

FIG. 11D is a perspective view illustrating an example of a thin large-screen television. In FIG. 11D, the thin large-screen television 1300 includes a thin large-screen television casing 1302, an audio outputting unit 1304 such as a speaker, and a display unit 1306 using the above-mentioned EL display device 1.

Since the electronic apparatus illustrated in FIGS. 11A to 11D include the display units 1001, 1101, 1206, and 1306 having the above-mentioned EL display device 1 and 2, respectively, the life span of the display unit can increase.

Since it employs the invention for sealing the display unit regardless of the area thereof, the thin large-screen television 1300 shown in FIG. 11D includes the display unit 1306 having a larger area (for example, a diagonal of 20 inches or more) than that of the related art.

The invention is not limited to the case that the EL display devices 1 and 2 are used as the display unit, but may apply to an electronic apparatus having them as the light emitting unit. For example, the invention may apply to a page printer (image forming apparatus) having the EL display devices 1 and 2 as an exposure head (line head).

What is claimed is:

1. A light emitting device comprising on a base member:
   a plurality of first electrodes;
   a barrier wall having a plurality of opening portions corresponding to the plurality of first electrodes;
   organic functional layers disposed in the opening portions;
   a second electrode covering the barrier wall and the organic functional layers;
   an organic buffer layer covering the second electrode, the organic buffer layer including a covering portion that covers the organic functional layers and a slope portion including a slope that extends from an edge of the covering portion;
   a gas barrier layer, having an inner surface in contact with a portion of the organic buffer layer and an outer surface, disposed to cover the organic buffer layer and surroundings and thereof;
   an outside reinforcing layer positioned in contact with the outer surface of the gas barrier layer, the outside reinforcing layer being disposed so as to not overlap the organic functional layers in plan view, and
   a protective layer covering the gas barrier layer and at least a part of the outside reinforcing layer.

2. The light emitting device according to claim 1, wherein the outside reinforcing layer is disposed to cover surroundings of edges of the organic buffer layer.

3. The light emitting device according to claim 1, wherein the outside reinforcing layer is disposed to cover an outer circumferential region of the gas barrier layer and surroundings thereof.

4. The light emitting device according to claim 1, further comprising an electrode protecting layer covering the second electrode.

5. The light emitting device according to claim 1, wherein a contact angle of an edge of the organic buffer layer is less than or equal to 45°.

6. The light emitting device according to claim 1, wherein the outside reinforcing layer is made of resin.

7. The light emitting device according to claim 6, wherein the outside reinforcing layer contains fine particles.

8. The light emitting device according to claim 6, wherein the outside reinforcing layer and the organic buffer layer are made of the same resin.

9. The light emitting device according to claim 1, wherein the protective layer is disposed to expose the outer circumferential region of the outside reinforcing layer.

10. The light emitting device according to claim 1, wherein the protective layer includes (1) an adhesive layer covering the gas barrier layer and (2) a surface protecting film.

11. An electronic apparatus comprising the light emitting device according to claim 1.

12. The light emitting device according to claim 1, wherein the part of the outside reinforcing layer is sandwiched between the gas barrier layer and the protective layer.

13. The light emitting device according to claim 1, wherein the organic buffer layer comprises fine particles.

14. The light emitting device according to claim 13, wherein the organic buffer layer comprises a content of 10% to 70% of fine particles.

15. The light emitting device according to claim 13, wherein the fine particles have diameters ranging from 10 nm to 1000 nm.

16. A method of manufacturing a light emitting device, the method comprising, on a base member:
    forming a plurality of first electrodes;
    forming a barrier wall having a plurality of opening portions corresponding to the plurality of first electrodes;
    forming organic functional layers disposed in the plurality of opening portions;
    forming a second electrode covering the barrier wall and the organic functional layers;
    forming an organic buffer layer covering the second electrode and having a flat top surface, the organic buffer layer including a covering portion that covers the organic functional layers and a slope portion including a slope that extends from an edge of the covering portion;
    forming a gas barrier layer covering the organic buffer layer, having an inner surface in contact with a portion of the organic buffer layer and an outer surface, disposed to cover the organic buffer layer and surroundings thereof; and
    forming an outside reinforcing layer positioned in contact with the outer layer of the gas barrier layer, the outside reinforcing layer being disposed so as to not overlap the organic functional layers in plan view; and
    forming a protective layer covering the gas barrier layer and at least a part of the outside reinforcing layer.

17. The method according to claim 16, wherein the forming of the outside reinforcing layer includes depositing an organic material containing fine particles on at least an outer circumferential region of the gas barrier layer.

18. The method according to claim 16, further comprising forming a protective layer covering the gas barrier layer and the outside reinforcing layer so that an outer circumferential region of the outside reinforcing layer is exposed.

19. The method according to claim 18, wherein the forming of the protective layer includes:

forming an adhesive layer covering the gas barrier layer and a part of the outside reinforcing layer;
disposing a surface protecting film on the adhesive layer; and
cutting the surface protecting film approximately along an outer circumference of the adhesive layer.

* * * * *